(12) United States Patent
Hwang et al.

(10) Patent No.: US 11,903,147 B2
(45) Date of Patent: Feb. 13, 2024

(54) ELECTRONIC DEVICE INCLUDING HOUSING AND METHOD OF PRODUCING THE HOUSING

(71) Applicant: Samsung Electronics Co., Ltd., Gyeonggi-do (KR)

(72) Inventors: Hangyu Hwang, Gyeonggi-do (KR); Youngjong Shin, Gyeonggi-do (KR); Sangbeom Ko, Gyeonggi-do (KR); Sungho Cho, Gyeonggi-do (KR); Sunyoung Ji, Gyeonggi-do (KR); Younghee Choi, Gyeonggi-do (KR); Changyoun Hwang, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 423 days.

(21) Appl. No.: 17/069,965

(22) Filed: Oct. 14, 2020

(65) Prior Publication Data
US 2021/0120681 A1 Apr. 22, 2021

(30) Foreign Application Priority Data

Oct. 16, 2019 (KR) .................. 10-2019-0128592
Jul. 22, 2020 (KR) .................. 10-2020-0091272

(51) Int. Cl.
*H05K 5/00* (2006.01)
*B29C 45/26* (2006.01)
(Continued)

(52) U.S. Cl.
CPC ......... *H05K 5/0004* (2013.01); *B29C 45/372* (2013.01); *H04M 1/0283* (2013.01); *B29L 2031/3475* (2013.01)

(58) Field of Classification Search
CPC ........ H05K 5/004; H05K 5/00; H05K 5/0047; H05K 5/0086; B29C 45/372; B29C 45/26;
(Continued)

(56) References Cited

U.S. PATENT DOCUMENTS

2005/0260386 A1 11/2005 Heinrich et al.
2008/0213541 A1 9/2008 Schilling et al.
(Continued)

FOREIGN PATENT DOCUMENTS

CN 104582352 A 4/2015
CN 110712340 A * 1/2020
(Continued)

OTHER PUBLICATIONS

Indian Office Action dated Mar. 22, 2022.
Extended European Search Report dated Oct. 10, 2022.
International Search Report dated Jan. 27, 2021.

*Primary Examiner* — Blane J Jackson
(74) *Attorney, Agent, or Firm* — Cha & Reiter, LLC

(57) ABSTRACT

An electronic device and method for forming a housing of the same is disclosed. The electronic device includes: a housing including: a first plate forming a front surface of the housing, a second plate integrally forming a rear surface and side surface of the housing, wherein a space is enclosed between the front surface, side surface and rear surface, and wherein the second plate includes a first surface forming the side and rear surfaces of the housing, and a second surface disposed opposite to the first surface, and a display disposed in the space and at least partially visible through the first plate, wherein at least a portion of the second surface includes a pattern having surface roughness having a height of 0.1 μm to 1 μm.

9 Claims, 27 Drawing Sheets

(51) Int. Cl.
*H04B 1/3827* (2015.01)
*H04M 1/02* (2006.01)
*B29C 45/37* (2006.01)
*B29L 31/34* (2006.01)

(58) Field of Classification Search
CPC .... H04M 1/0283; H04M 1/02; H04M 1/0202; H29L 2031/3475; B29L 2031/3475; H04B 1/3827; H04B 1/3833
See application file for complete search history.

(56) References Cited

U.S. PATENT DOCUMENTS

| | | |
|---|---|---|
| 2014/0125636 A1 | 5/2014 | Kwon et al. |
| 2014/0268525 A1 | 9/2014 | Hwang et al. |
| 2017/0335610 A1 | 11/2017 | Hall et al. |
| 2019/0042006 A1 | 2/2019 | Hsieh et al. |
| 2019/0144332 A1 | 5/2019 | Kim et al. |

FOREIGN PATENT DOCUMENTS

| | | | | |
|---|---|---|---|---|
| CN | 110936675 A | * | 3/2020 | ............ B32B 27/06 |
| EP | 4050869 A1 | * | 8/2022 | ............ C03B 23/03 |
| JP | 2000270065 A | * | 9/2000 | ......... H01M 2/1066 |
| JP | 2010-231002 A | | 10/2010 | |
| KR | 10-2014-0112326 A | | 9/2014 | |
| KR | 10-1918983 B1 | | 2/2019 | |

\* cited by examiner

ELECTRONIC DEVICE INCLUDING HOUSING AND METHOD OF PRODUCING THE HOUSING

CROSS-REFERENCE TO RELATED APPLICATION(S)

This application is based on and claims priority under 35 U.S.C. 119 to Korean Patent Application No. 10-2019-0128592, filed on Oct. 16, 2019, and Korean Patent Application No. 10-2020-0091272, filed on Jul. 22, 2020 in the Korean Intellectual Property Office, the disclosures of which are herein incorporated by reference in their entireties.

TECHNICAL FIELD

An embodiment of the disclosure relates to electronic devices, and more particularly, to an electronic device having a housing on which patterns are deposited during manufacturing.

BACKGROUND

Design aesthetics increasingly differentiate competing electronic devices to consumers, as these devices become increasingly upscale in specification. As a result, there is impetus to form the external housing of these devices to produce a visually pleasing design with a luxurious texture.

For example, a visually pleasing surface texture may be implemented by disposing a film (e.g., a deco film) on a surface of the housing.

SUMMARY

The surface of the housing may be formed having a shape including edges or corners where several different surfaces meet. When a flat-shaped film is bonded to the surface, the film does not adhere evenly at the edges or corners, resulting in a bonding failure such as folding or wrinkles.

In another example, the visual surface texture may be implemented by disposing a patterned layer on a surface of the housing through ultraviolet (UV) molding. However, when the surface of the housing is not flat, and includes edges or corners where several disparate surfaces meet, it may be difficult to perform a uniform rolling application of the molding liquid (e.g., a UV curable resin) to form the layer properly on the surface during UV molding.

An embodiment of the disclosure provides an electronic device including a housing and a method of producing the housing for easily implementing a visual surface texture without a restriction on a surface shape of the housing.

According to an embodiment of the disclosure, an electronic device includes a housing including: a first plate forming a front surface of the housing, a second plate integrally forming a rear surface and side surface of the housing, wherein a space is enclosed between the front surface, side surface and rear surface, and wherein the second plate includes a first surface forming the side and rear surfaces of the housing, and a second surface disposed opposite to the first surface, and a display disposed in the space and at least partially visible through the first plate, wherein at least a portion of the second surface includes a pattern having surface roughness having a height of 0.1 µm to 1 µm.

According to certain embodiments of the disclosure, an electronic device includes a housing defining a front surface, a rear surface, and a side surface, and a space enclosed between the front surface and the rear surface, wherein the housing includes: a first plate forming the front surface, a second plate forming the rear surface and the side surface, integrally extending from the side surface to the rear surface, wherein the second plate includes a first surface forming the rear surface and a second surface disposed opposite to the first surface, a first layer bonded to the second plate within the space and including at least one pattern, wherein the first layer is disposed at the second surface between the second surface and the second layer, and a second layer bonded to the first layer, the second layer including at least one color; and a display disposed in the space and at least partially visible through the first plate, wherein at least a portion of the second surface includes a pattern having surface roughness having a height of 0.1 µm to 1 µm.

BRIEF DESCRIPTION OF THE DRAWINGS

In the drawings, the same or similar reference numerals may be used for the same or similar components.

DETAILED DESCRIPTION

Figure 1A:
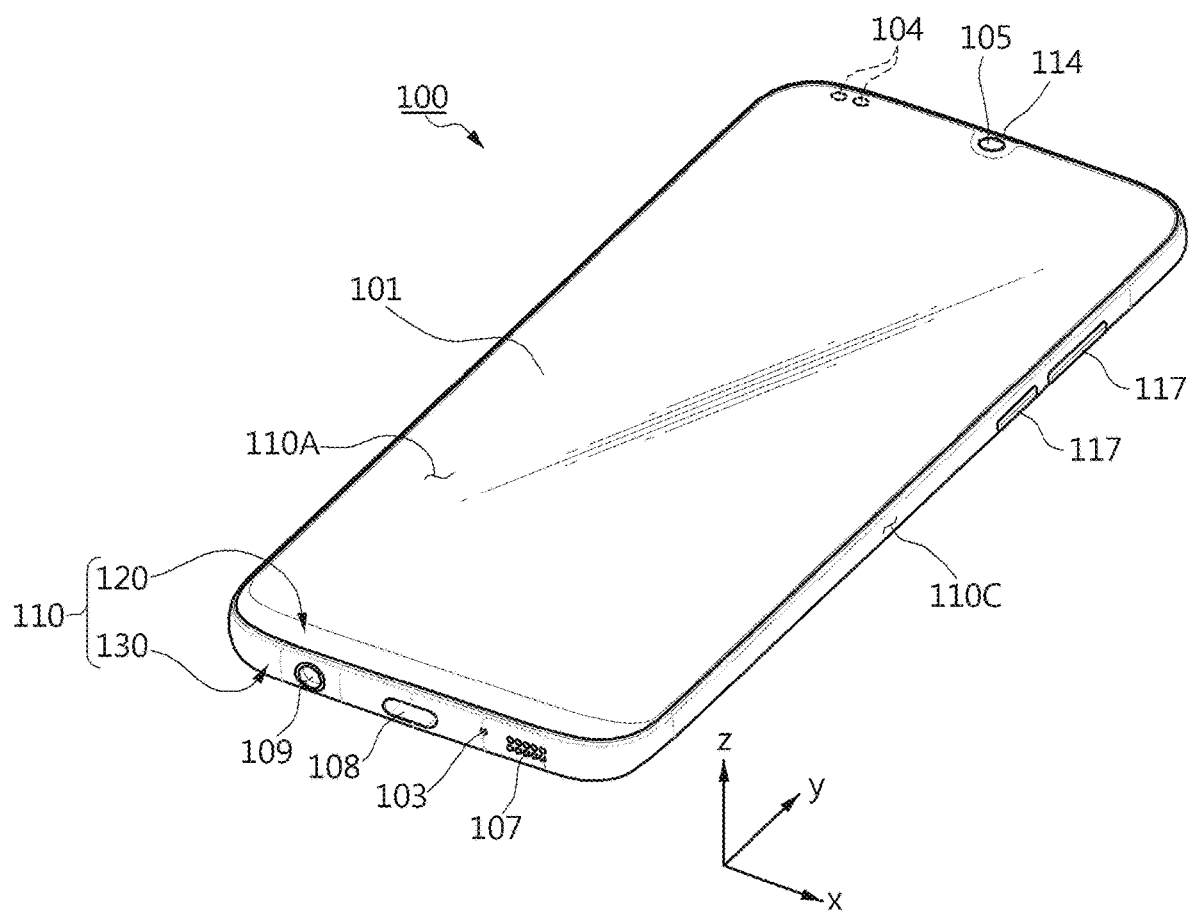
FIG. 1A is a perspective view illustrating a front surface of a mobile electronic device according to an embodiment.

The following description with reference to the accompanying drawings is provided to assist in a comprehensive understanding of certain embodiments of the disclosure as defined by the claims and their equivalents. It includes various specific details to assist in that understanding but these are to be regarded as mere examples. Accordingly, those of ordinary skill in the art will recognize that various changes and modifications of the certain embodiments described herein can be made without departing from the disclosure. In addition, descriptions of well-known functions and implementations are omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of certain embodiments of the disclosure is provided for illustration purpose only and not for the purpose of limiting the disclosure as defined by the appended claims and their equivalents.

With regard to the description of the drawings, similar reference numerals may be used to refer to similar or related elements.

A singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases.

As used herein, such terms as "1st" and "2nd", or "first" and "second" may be used to simply distinguish a corresponding component from another, and does not limit the components in other aspect (e.g., importance or order). If an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

An electronic device according to an embodiment may be one of various types of electronic devices. The electronic device may include a portable communication device (e.g., a smart phone), a computer device, a portable multimedia device, a portable medical device, a camera, a wearable device, or a home appliance. However, the electronic device is not limited to any of those described above.

FIG. 1A is a perspective view illustrating a front surface of a mobile electronic device 100 according to an embodiment of the disclosure.

Figure 1B:
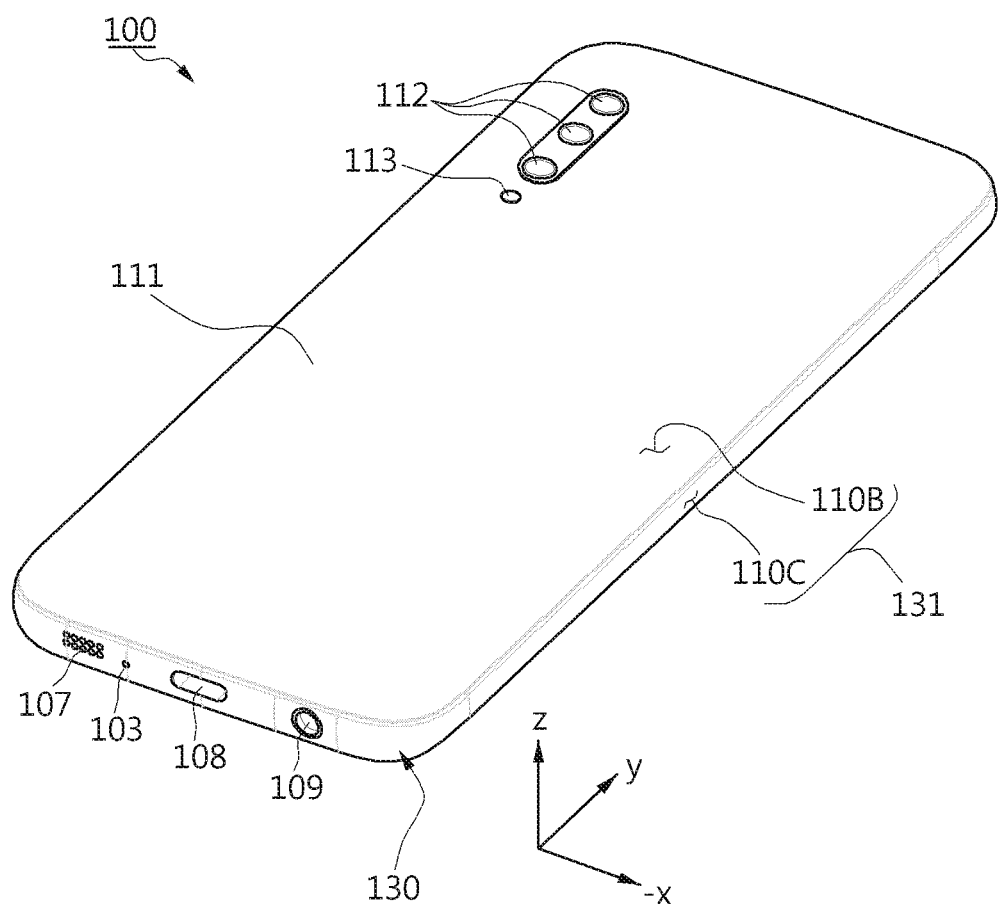
FIG. 1B is a perspective view illustrating a rear surface of the electronic device of FIG. 1A according to an embodiment.

FIG. 1B is a perspective view illustrating a rear surface of the electronic device 100 of FIG. 1A according to an embodiment of the disclosure.

Referring to FIGS. 1A and 1B, according to an embodiment, an electronic device 100 may include a housing 110 that includes a front surface 110A, a rear surface 110B, and a lateral surface 110C that surrounds a space between the front surface 110A and the rear surface 110B. According to another embodiment, the housing 110 may refer to a structure that forms at least a part of the front surface 110A, the rear surface 110B, and the lateral surface 110C.

According to an embodiment, the front surface 110A may be formed of a first plate (or front plate) 120 (e.g., a glass plate or polymer plate coated with a variety of coating layers) at least a part of which is substantially transparent. The first plate 120 may be referred to the term "first housing part".

According to an embodiment, the rear surface 110B and the side surface 110C may be formed by the second plate 130. For example, the second plate 130 may be extended integrally from the rear surface 110B to the side surface 110C. The second plate 130 may include a first surface 131 including the rear surface 110B and the side surface 110C, and a second surface (not illustrated) disposed opposite to the first surface 131. Various layers may be disposed at the second surface. At least one of the various layers disposed at the second surface may be made of an opaque material to cover the inside of the electronic device 100. In the following description, the second plate 130 may also be referred to as a "second housing portion".

According to an embodiment, the electronic device 100 may include at least one of a display 101, audio modules 103, 107 and 114, sensor module 104, camera modules 105, 112 and 113, key input devices 117, and connector holes 108 and 109. In certain embodiments, the electronic device 100 may omit at least one (e.g., the key input devices 117) of the above components, or may further include other components (e.g., a fingerprint sensor or a light emitting device).

The display 101 may be exposed through a substantial portion of the front plate 120, for example. In certain embodiments, outlines (i.e., edges and corners) of the display 101 may have substantially the same form as those of the first plate 120. In another embodiment (not shown), the spacing between the outline of the display 101 and the outline of the first plate 120 may be substantially unchanged in order to enlarge the exposed area of the display 101.

In another embodiment (not shown), a recess or opening may be formed in a portion of a display area of the display 101 to accommodate or to be aligned with at least one of audio modules (e.g., the audio module 114), sensor module (e.g., the sensor module 104), and camera modules (e.g., the camera module 105). In another embodiment (not shown), at least one of the audio modules (e.g., the audio module 114), the sensor modules (e.g., the sensor module 104), and the camera modules (e.g., the camera module 105) may be disposed on the back of the display area of the display 101. In another embodiment (not shown), the display 101 may be combined with, or adjacent to, a touch sensing circuit, a pressure sensor capable of measuring the touch strength (pressure), and/or a digitizer for detecting a stylus pen.

The audio modules 103, 107 and 114 may correspond to a first audio module 103, a second audio module 107, and a third audio module 114. The first audio module 103 may include a microphone for acquiring external sounds and a microphone hole of the housing 110 corresponding to the microphone. In certain embodiments, the first audio module 103 may include a plurality of microphones to sense a sound direction. The second audio module 107 may include an external speaker and a speaker hole of the housing 110 corresponding to the external speaker. The third audio module 114 may include a call speaker (e.g. a call receiver) and a speaker hole of the housing 110 corresponding to the call speaker. In certain embodiments, the microphone hole and the speaker holes may be implemented as a single hole, or a speaker (e.g., a piezo speaker) may be provided without a speaker hole.

The sensor module 104 may generate electrical signals or data corresponding to an internal operating state of the electronic device 100 or to an external environmental condition. The sensor module 104 may include, for example, a proximity sensor that generate signals of a proximity of an external object based on lights that pass through a part of the front surface 110A of the housing 110. In certain embodiments, the sensor module 104 may include a biometric sensor, such as a fingerprint sensor, that generate signals of biometric data based on lights that pass through a part of the front surface 110A of the housing 110. In certain embodiments, the fingerprint sensor may be disposed on the back of the display area of the display 101. In certain embodiments (not shown), the electronic device 100 may include another sensor module, such as a heart rate monitor (HRM) sensor or a fingerprint sensor, disposed on the rear surface 110B of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor (e.g., the sensor module 104).

The camera modules 105, 112 and 113 may include a first camera device (e.g., the camera module 105), a second camera device (e.g., the camera module 112), and/or a flash (e.g., the camera module 113). The first camera device may generate image signals based on lights that pass through a part of the front surface 110A of the housing 110. The second camera device and the flash may be disposed on the rear surface 110B of the housing 110. The camera module 105 or the camera module 112 may include one or more lenses, an image sensor, and/or an image signal processor. The flash may include, for example, a light emitting diode or a xenon lamp. In certain embodiments, two or more lenses (infrared cameras, wide angle and telephoto lenses) and image sensors may be disposed on one side of the electronic device 100.

The key input devices 117 may be disposed on the lateral surface 110C of the housing 110. In another embodiment, the electronic device 100 may not include some or all of the key input devices 117 described above, and the key input devices 117 which are not included may be implemented in another form such as a soft key on the display 101. In certain embodiments, the key input devices 117 may include a sensor module (not shown) disposed on the rear surface 110B of the housing 110.

The light emitting device (not shown) may be disposed on the front surface 110A of the housing 110, for example. For example, the light emitting device may provide status information of the electronic device 100 in an optical form. In certain embodiments, the light emitting device may provide a light source associated with the operation of the camera module 105. The light emitting device may include, for example, a light emitting diode (LED), an infrared (IR) LED, or a xenon lamp.

The connector holes 108 and 109 may include a first connector hole (e.g., the connector hole 108) adapted for a connector (e.g., a universal serial bus (USB) connector) for transmitting and receiving power and/or data to and from an external electronic device, and/or a second connector hole (e.g., the connector hole 109) adapted for a connector (e.g., an earphone jack) for transmitting and receiving an audio signal to and from an external electronic device.

Figure 2:
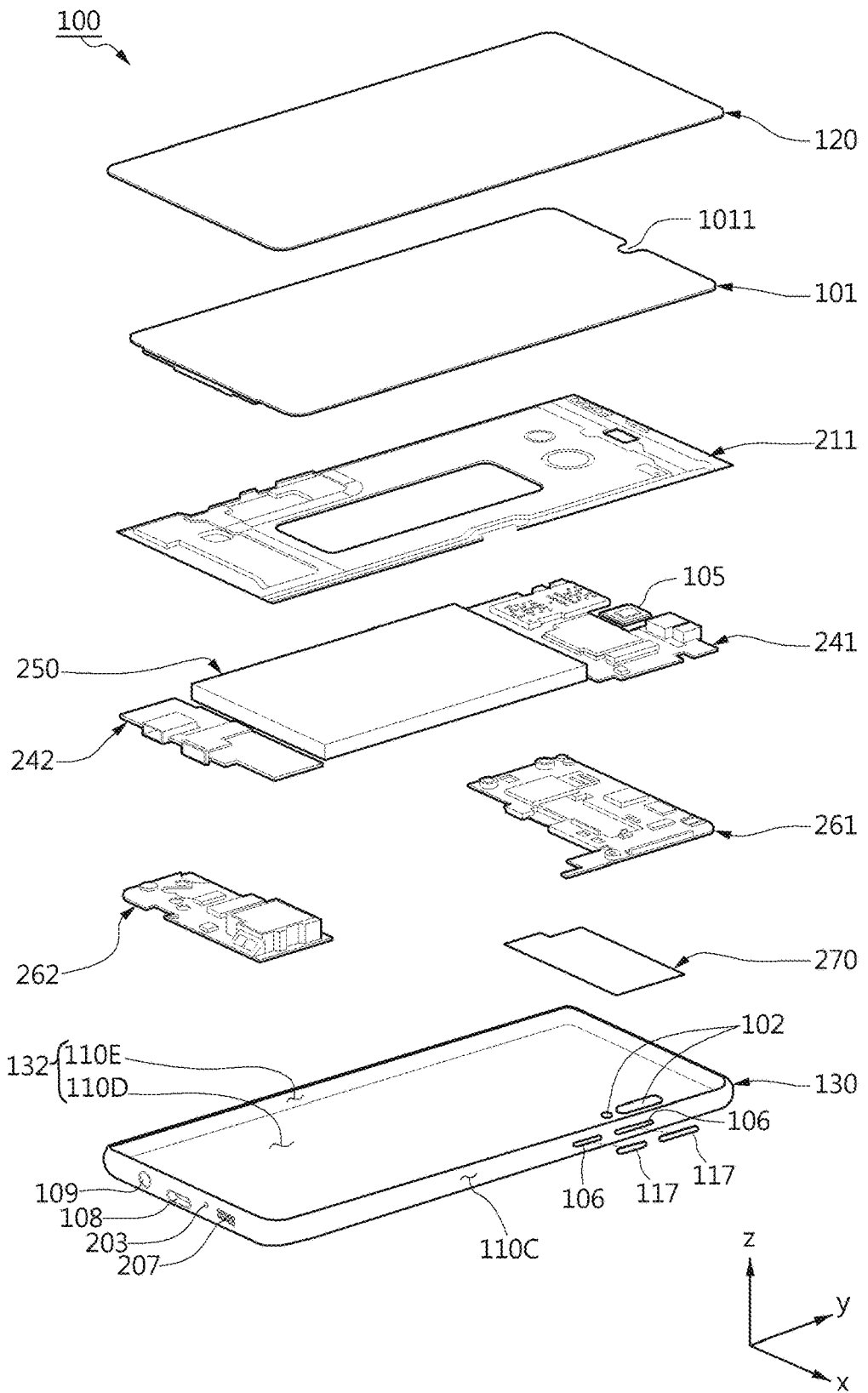
FIG. 2 is an exploded perspective view illustrating the electronic device of FIG. 1A according to an embodiment.

FIG. 2 is an exploded perspective view illustrating the electronic device 100 of FIG. 1A according to an embodiment.

With reference to FIG. 2, according to an embodiment, the electronic device 100 may include a first plate (or first housing portion) 120, second plate (or second housing portion) 130, first support member 211 (e.g., bracket), display 101, first substrate assembly 241, second substrate assembly 242, battery 250, second support member 261, third support member 262, or antenna structure 270. In some embodiments, the electronic device 100 may omit at least one (e.g., the first support member 211, the second support member 261, or the third support member 262) of the components or may additionally include other components. At least one of the components of the electronic device 100 may be the same as or similar to at least one of the components of the electronic device 100 of FIG. 1A or 1B, and repeated descriptions thereof will be omitted below.

The first support member 211 may be, for example, disposed inside the electronic device 100 to be connected to the second plate 130. The first support member 211 may be made of, for example, a metal material and/or a non-metal (e.g., polymer) material.

The display 101 may be, for example, coupled to one surface of the first support member 211 and be disposed between the first support member 211 and the first plate 120. The first substrate assembly 241 and the second substrate assembly 242 may be, for example, coupled to the other surface of the first support member 211 and be interposed between the first support member 211 and the second plate 130.

According to an embodiment, the first substrate assembly 241 may include a first printed circuit board (PCB). The display 101 or the first camera device 105 may be electrically connected to the first printed circuit board through various electrical paths such as a flexible printed circuit board (FPCB). The first substrate assembly 241 may include various electronic components electrically connected to the first printed circuit board. An electronic component may be disposed at the first printed circuit board or may be electrically connected to the first printed circuit board through an electrical path such as a cable or an FPCB.

According to certain embodiments, the first substrate assembly 241 may include a main PCB, a slave PCB disposed to partially overlap with the main PCB, and an interposer substrate between the main PCB and the slave PCB, when viewed from above the first plate 120.

According to an embodiment, when viewed from above the first plate 120, the second substrate assembly 242 may be disposed to be spaced apart from the first substrate assembly 241 with the battery 250 interposed therebetween. The second substrate assembly 242 may include a second printed circuit board electrically connected to the first printed circuit board of the first substrate assembly 241. The second substrate assembly 242 may include various electronic components electrically connected to the second printed circuit board. An electronic component may be disposed at the second printed circuit board or may be electrically connected to the second printed circuit board through an electrical path such as a cable or an FPCB. According to an embodiment, the electronic component may include a USB connector using the first connector hole 108, an earphone jack using the second connector hole 109, a microphone using the microphone hole 203, or a speaker using a speaker hole 207.

According to an embodiment, the battery 250 may be disposed between the first support member 211 and the second plate 130, and be coupled to the first support member 211. The battery 250 is a device for supplying power to at least one component of the electronic device 100, and may include, for example, a non-rechargeable primary cell, a rechargeable secondary cell, or a fuel cell. At least a portion of the battery 250 may be, for example, disposed on substantially the same plane as that of a first printed circuit board of the first substrate assembly 241 or a second printed circuit board of the second substrate assembly 242. The battery 250 may be integrally disposed inside the electronic device 100 or may be disposed detachably from the electronic device 100.

According to an embodiment, the second support member 261 may be disposed between the first support member 211 and the second plate 130 and be coupled to the first support member 211 through a fastening element such as a bolt. At least a portion of the first substrate assembly 241 may be disposed between the first support member 211 and the second support member 261, and the second support member 261 may cover the first substrate assembly 241 for protection.

According to an embodiment, when viewed from above the first plate 120, the third support member 262 may be disposed to be spaced apart from the second support member 261 with the battery 250 interposed therebetween. The third support member 262 may be disposed between the first support member 211 and the second plate 130, and be coupled to the first support member 211 through a fastening element such as a bolt. At least a portion of the second substrate assembly 242 may be disposed between the first support member 211 and the third support member 262, and the third support member 262 may cover the second substrate assembly 242 for protection.

According to an embodiment, the second support member 261 and/or the third support member 262 may be made of a metal material and/or a non-metal material (e.g., polymer). According to certain embodiments, the second support member 261 and/or the third support member 262 may be referred to as a rear case.

According to an embodiment, the antenna structure 270 may be disposed between the second support member 261 and the second plate. The antenna structure 270 may be implemented in the form of a film such as an FPCB. According to an embodiment, the antenna structure 270 may include at least one conductive pattern used as a loop type radiator. For example, the at least one conductive pattern may include a planar spiral conductive pattern (e.g., planar coil or pattern coil).

According to an embodiment, the conductive pattern of the antenna structure 270 may be electrically connected to a wireless communication circuit disposed at the first substrate assembly 241. The conductive pattern may be used for short-range wireless communication such as near field communication (NFC). The conductive pattern may be used for magnetic secure transmission (MST) for transmitting and/or receiving a magnetic signal.

According to certain embodiments, the conductive pattern of the antenna structure 270 may be electrically connected to a power transmission and reception circuit disposed at the first substrate assembly 241. The power transmission and reception circuit may wirelessly receive power from an external electronic device through a conductive pattern or may wirelessly transmit power to the external electronic device. The power transmission and reception circuit may include, for example, a power management integrated circuit (PMIC) or a charger integrated circuit (IC), and charge the battery 250 using power received through a conductive pattern.

According to an embodiment, the display 101 may include an opening 1011 formed in at least a partial area corresponding to an optical sensor (e.g., the first camera device 105 or the biometric sensor) disposed inside the electronic device 100. The opening 1011 may be formed as, for example, a notch shape. According to some embodiments, the opening 1011 may be implemented in the form of a through hole. The optical sensor may receive external light through the opening 1011 of the display 101 and a partial area of the first plate 120 aligned therewith. According to certain embodiments (not illustrated), the opening 1011 of the display 101 may be replaced with a substantially transparent area formed by changing a pixel structure and/or a wiring structure.

According to an embodiment, the second plate 130 may include a microphone hole 203, a speaker hole 207, or connector holes 108 and 109. According to an embodiment, the second plate 130 may include openings 102 for disposing to expose the second camera device 112 and the flash 113 included in the first substrate assembly 241 at the rear surface 110B. According to an embodiment, the second plate 130 may include openings 106 for disposing the key input devices 117.

According to an embodiment, the second plate 130 may include a first surface 131 (see FIG. 1B) including the rear surface 110B and the side surface 110C and a second surface 132 disposed opposite to the first surface 131. The second surface 132 may be formed in a shape along the first surface 131 and include, for example, a portion 110D along the rear surface 110B and a portion 110E along the side surface 110C.

According to an embodiment, a fine pattern may be formed in the second surface 132 or inside the second plate 130 close to the second surface 132. The fine pattern may separate a spectrum of light according to a wavelength by a diffraction phenomenon of light. The second plate 130 may enable viewing of monochromatic lights of visible light through the fine pattern. The second plate 130 may further include one or more layers stacked on the second surface 132 to provide a visual effect.

According to some embodiments (not illustrated), the housing 110 may include a rear plate forming the rear surface 110B and a side bezel structure (or side member) forming the side surface 110C instead of the second plate 130. According to certain embodiments, the rear plate and the side bezel structure may include a fine pattern that enables viewing of monochromatic lights of visible light through a spectrum.

Figure 3:
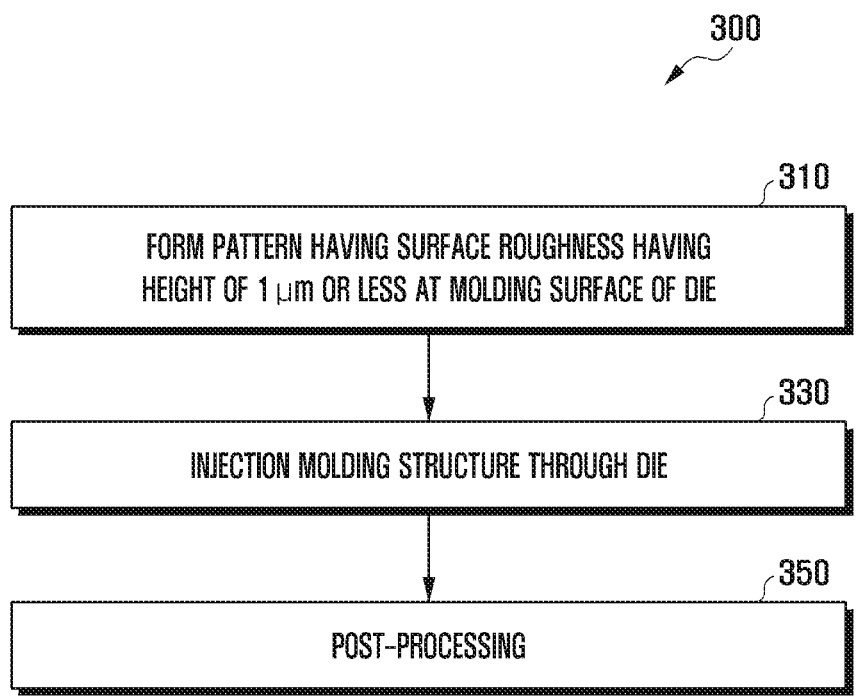
FIG. 3 is a flowchart illustrating a production flow of a cover according to an embodiment.

FIG. 3 is a flowchart illustrating a production flow 300 of a cover according to an embodiment. FIGS. 4A, 4B, 5, 6, 7A, 7B, 7C, 8, 9, 10, 11, 12, 13A, 13B, 14A, 14B, 15, 16, 17, 18A, 18B, and 18C are diagrams illustrating the production flow 300 of FIG. 3 according to an embodiment.

With reference to FIG. 3, according to an embodiment, in operation 310, a pattern may be formed at a molding surface of a die, the pattern having surface roughness having a height of about 1 μm (micrometer) or less. For example, the surface roughness may be determined as a maximum average roughness, in which a maximum height Rmax from a lowest point to a highest point is about 1 μm or less. According to an embodiment, a molding surface of the die may include a pattern having surface roughness of about 0.1 μm to 1 μm. The molding surface of the die is a surface on which a molten resin contacts during injection molding, and may form an outer surface of a mold-injected structure. In operation 330, a structure for the housing of the electronic device may be injection molded through the die (e.g., the die 400 of FIG. 4A). According to an embodiment, in operation 350, post-processing of a structure mold-injected through the die may be performed.

Figure 4A:
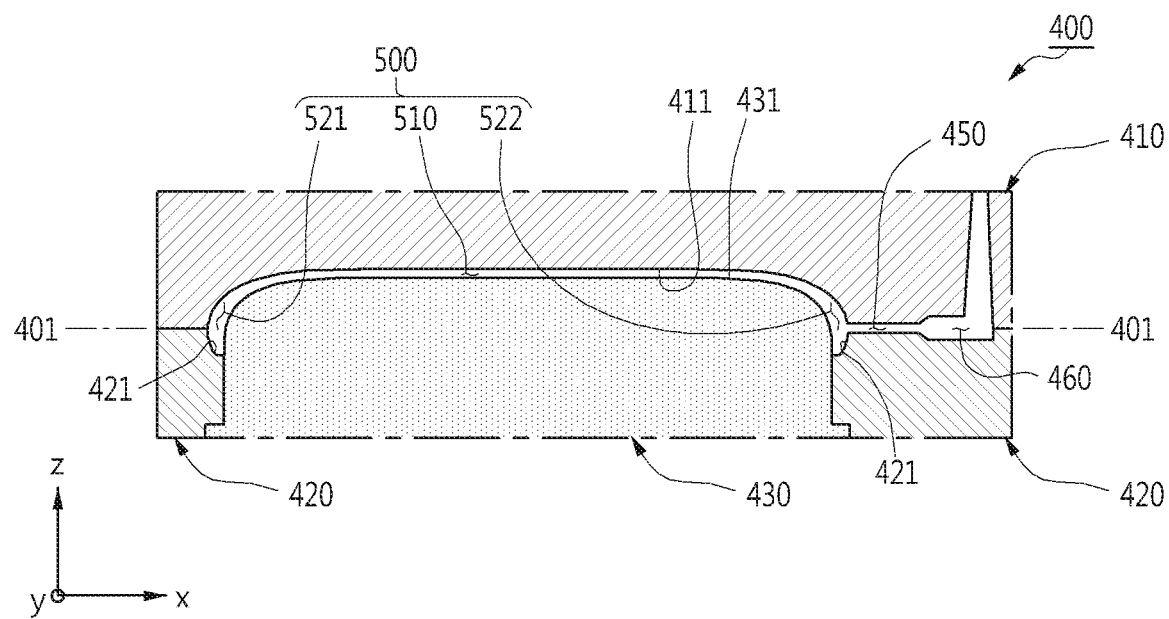
FIGS. 4A and 4B are cross-sectional views illustrating a die according to an embodiment.
Figure 4B:
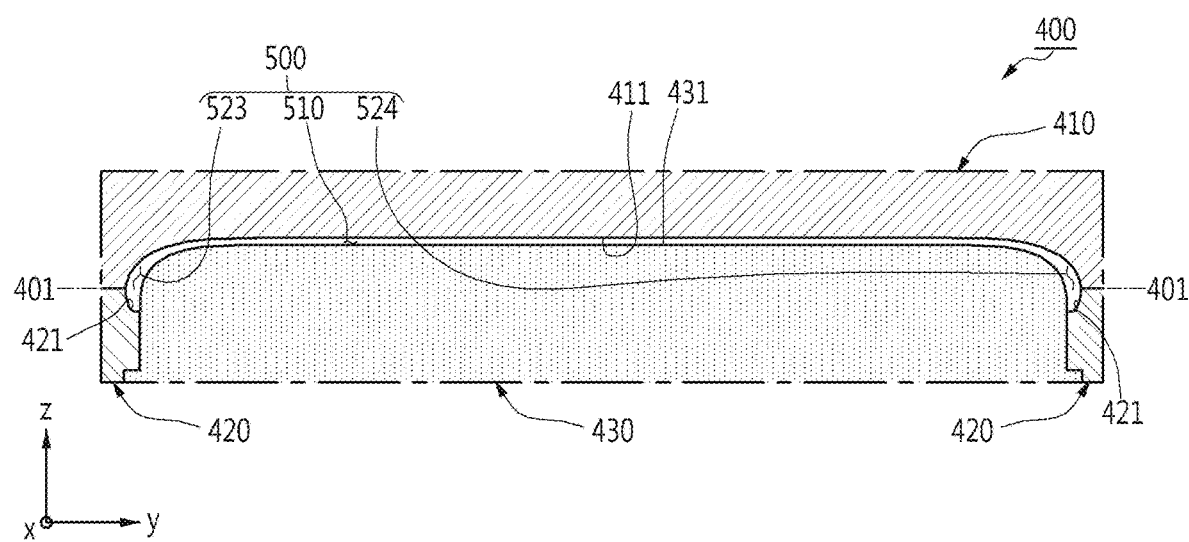

FIGS. 4A and 4B are cross-sectional views illustrating a die 400 according to an embodiment.

With reference to FIGS. 4A and 4B, for example, the die 400 may include a first template 410, a second template 420, or a core block (or core) 430.

According to an embodiment, the first template 410 may be a mold base including a cavity in which a molten resin may flow. For example, the first template 410 may be a fixed bolster plate or a cavity plate. The first template 410 may include the cavity, which is an empty space in the form of a hollow in a direction from the second template 420 toward the first template 410 (e.g., +z axis direction). According to certain embodiments (not illustrated), a cavity block including a cavity may be disposed at the first template 410 instead of a structure of forming a cavity in the first template 410.

According to an embodiment, the second template 420 may be a mold base in which the core block 430 is disposed. For example, the second template 420 may be a moving bolster plate or a core plate. The core block 430 may form a molding space 500 together with the cavity of the first template 410.

The mold-injected structure (not illustrated) may include, for example, a first surface and a second surface disposed opposite to the first surface. According to an embodiment, the first template 410 may include a first molding surface 411 forming a part of the cavity, and the first molding surface 411 may serve to form a part of the first surface of the mold-injected structure. According to an embodiment, the second template 420 may include a second molding surface 421 forming a part of the cavity, and the second molding surface 421 may serve to form a part of the first surface of the mold-injected structure. The second molding surface 421 may be disposed along an edge of the first molding surface 411. According to an embodiment, the core block 430 may include a third molding surface 431 that serves to form a second surface of a mold-injected structure. The molding space 500 may be formed by the first molding surface 411, the second molding surface 421, and the third molding surface 431. According to certain embodiments, the die is not limited to the embodiment of FIGS. 4A and 4B, and may be implemented in various other structures to form the molding space 500.

Figure 5:
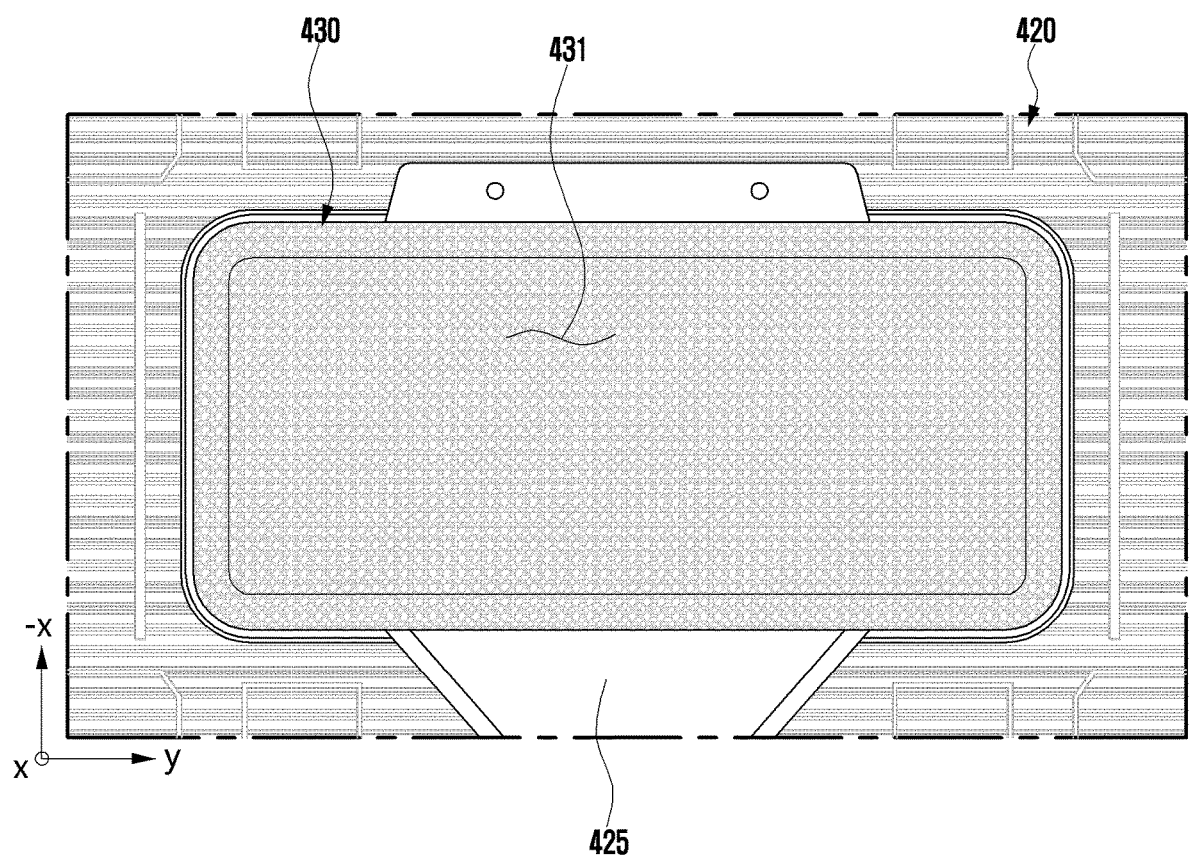
FIG. 5 is a diagram illustrating a second template and a core block of a die according to an embodiment.

According to an embodiment, a fine pattern (e.g., uneven surface) may be formed at the third molding surface 431 of the core block 430. FIG. 5 illustrates a second template 420 and a core block 430 of the die 400 according to an embodiment. With reference to FIG. 5, a fine pattern formed at the third molding surface 431 of the core block 430 may separate a spectrum of light according to a wavelength by a diffraction phenomenon of light. For example, when viewing the third molding surface 431, monochromatic lights of visible light may be viewed through the fine pattern. According to an embodiment, the structure mold-injected through the die 400 of FIG. 4A may have a pattern in which the third molding surface 431 of the core block 430 is imprinted and enables viewing of monochromatic lights of visible light by separating a spectrum of light according to a wavelength by a diffraction phenomenon of light.

With reference to FIG. 4A, the die 400 may include, for example, a runner 460, which is a flow passage between a sprue bush (e.g., a die inlet device for injecting a molten resin) (not illustrated) and the molding space 500. The die 400 may include, for example, a gate 450, which is an inlet that enables a molten resin to flow from the runner 460 to the molding space 500. During injection molding, the molten resin may enter into the molding space 500 through the sprue bush, the runner 460, and the gate 450. The gate 450 and/or the runner 460 may be formed, for example, in a space between the first template 410 and the second template 420 in a closed state of the die 400, as illustrated in FIGS. 4A and 4B. According to certain embodiments, the position, number, or shape of gates or runners is not limited to the embodiment of FIG. 4A and may be various.

With reference to FIG. 4A, in an embodiment, when viewed in an x-z cross-section, the molding space 500 may include a flat space 510 and a first curved space 521 and a second curved space 522 connected to the flat space 510 and disposed at both sides with the flat space 510 interposed therebetween. With reference to FIG. 4B, in an embodiment, when viewed in a y-z cross-section, the molding space 500 may include a third curved space 523 and a fourth curved space 524 connected to the flat space 510 and disposed at both sides with the flat space 510 interposed therebetween. The first curved space 521, the second curved space 522, the third curved space 523, and the fourth curved space 524 may be curved in a −z axis direction. When viewed in an x-y plane, the first curved space 521 and the second curved space 522 may be extended parallel to each other. When viewed in the x-y plane, the third curved space 523 and the fourth curved space 524 may be extended parallel to each other. The first curved space 521 may connect one end of the third curved space 523 and one end of the fourth curved space 524, and the second curved space 522 may connect the other end of the third curved space 523 and the other end of the fourth curved space 524. According to certain embodiments (not illustrated), the molding space 500 may include a curved corner space connecting the first curved space 521 and the third curved space 523, a curved corner space connecting the first curved space 521 and the fourth curved space 524, a curved corner space connecting the second curved space 522 and the third curved space 523, and a curved corner space connecting the second curved space 522 and the fourth curved space 524. According to certain embodiments, when viewed in an x-z cross-section, the first curved space 521 and the second curved space 522 may be at least partially symmetrical to each other with the flat space 510 interposed therebetween. According to certain embodiments, when viewed in a y-z cross-section, the third curved space 523 and the fourth curved space 524 may be at least partially symmetrical to each other with the flat space 510 interposed therebetween.

With reference to FIG. 4A, in an embodiment, the gate 450 may be implemented in the form of a side gate disposed at a die parting line 401. For example, the gate 450 may be disposed next to the molding space 500 on the die parting line 401. The die parting line 401 may indicate a portion in which the first template 410 and the second template 420 are divided so that the mold-injected structure may be taken out by opening the die 400. According to an embodiment, the die parting line 401 may be positioned to correspond to the curved spaces 521, 522, 523, and 524. For example, the die parting line 401 may be positioned so that one surface of the curved spaces 521, 522, 523, and 524 may be formed by the first molding surface 411 of the first template 410 and the second molding surface 421 of the second template 420. The die parting line 401 and the gate 450 related thereto according to the embodiment of FIG. 5 prevent the die 400 from having a locking structure such as an undercut; thus, the mold-injected structure may be taken out from the die 400.

According to an embodiment, a molten resin may be injected into the molding space 500 in a state in which the die 400 is closed, as illustrated in FIGS. 4A and 4B. The molten resin occupying the molding space may be solidified by circulating cooling water through the die 400. After the solidification, when the second template 420 is transferred and the die 400 is opened, the mold-injected structure may be disposed at the core block 430. The mold-injected structure may include an extension portion formed through the gate 450. When an ejector pin pushes the extension portion, the mold-injected structure may be separated from the core block 430. When a part of the third molding surface 431 is implemented as a part of the ejector pin, the pattern imprinted in the structure may be damaged by pressing one surface (the surface in which the pattern of the third molding surface 431 is imprinted) of the structure in which the ejector pin is mold-injected. When a part of the third molding surface 431 is implemented as a part of the ejector pin, polishing may be performed so that the surface of the ejector pin may be smoothly connected to a peripheral surface area of the third molding surface 431. The pattern formed in the third molding surface 431 may be damaged by the polishing. The gate 450 in the form of a side gate and a structure related thereto according to an embodiment may enable the structure to be easily taken out of the die 400 without damage to a pattern formed in the mold-injected structure.

According to certain embodiments, the gate 450 may be formed as a fan gate. For example, when viewed in the −z axis direction, the fan gate is a gate in a form in which a portion connected to the molding space 500 is widened, and a flow tip thereof may be formed to be wide and uniform. The fan gate may reduce molding defects when the structure is mold-injected through the molding space 500 of a form having the flat space 510 and the curved spaces 521, 522, 523, and 524. With reference to FIGS. 4B and 5, the second template 420 may include one side space 425 of the gate 450. The one side space 425 may have a shape in which a width in the y-axis direction increases toward a portion connected to the molding space 500.

Figure 6:
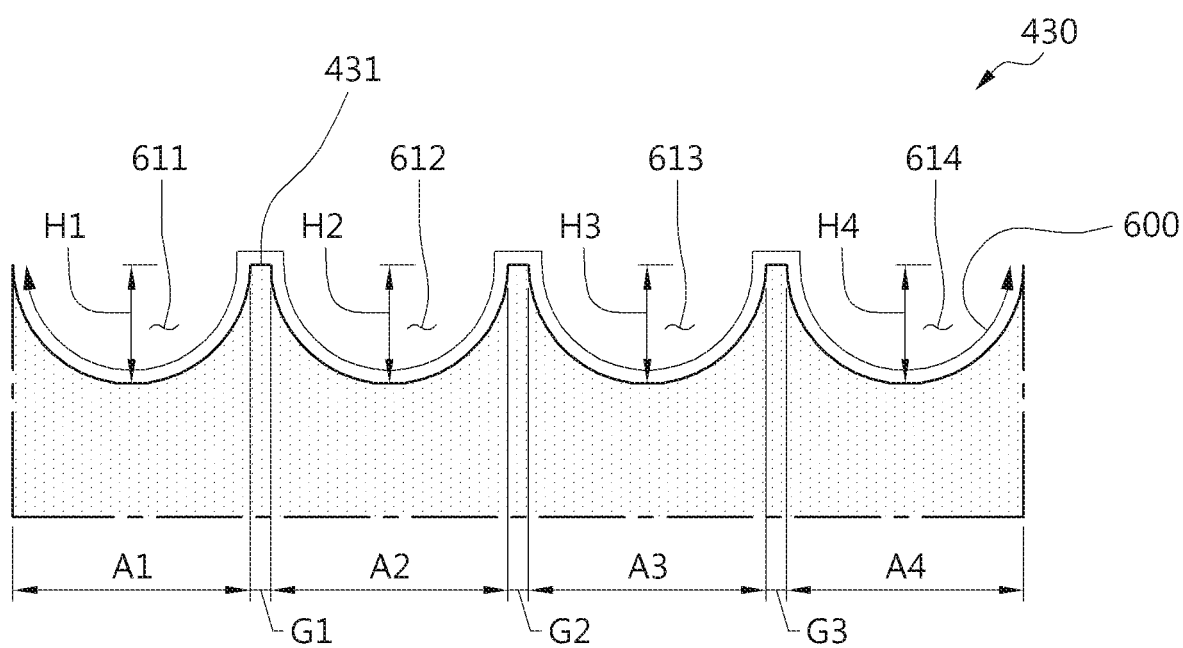
FIG. 6 is a cross-sectional view illustrating a pattern formed at a third molding surface of a core block according to an embodiment.

FIG. 6 is a cross-sectional view illustrating a pattern formed at a third molding surface 431 of a core block 430 according to an embodiment.

With reference to FIG. 6, in an embodiment, a pattern 600 (e.g., uneven surface) including a plurality of dimples 611, 612, 613, and 614 may be formed at the third molding surface 431 of the core block 430. The dimples may refer to recessed grooves. According to certain embodiments, dimples may be referred to by other terms of the same level, such as a pit or a recess. According to an embodiment, the dimple may separate a spectrum of light according to a wavelength by a diffraction phenomenon of light. According to certain embodiments, the plurality of dimples may be arranged in various directions along at least a portion of the third molding surface 431.

According to an embodiment, the plurality of dimples 611, 612, 613, and 614 may have substantially the same shape. For example, when viewed in cross-section, the plurality of dimples 611, 612, 613, and 614 may include a concave round space or a hemispherical space. For example, diameters A1, A2, A3, and A4 of the plurality of dimples 611, 612, 613, and 614 may be substantially the same. For example, when viewed in cross-section, depths H1, H2, H3, and H4 of the plurality of dimples 611, 612, 613, and 614 may be substantially the same. According to certain embodiments, gaps G1, G2, and G3 in which the plurality of dimples 611, 612, 613, and 614 are arranged may be substantially the same.

In certain embodiments (not illustrated), some of the plurality of dimples 611, 612, 613, and 614 and other dimples may be formed in different shapes. For example, some of the diameters A1, A2, A3, and A4 of the plurality of dimples 611, 612, 613, and 614 may be different from others. For example, some of the depths H1, H2, H3, and H4 of the plurality of dimples 611, 612, 613, and 614 may be different from others. For example, a cross-sectional shape of some of the plurality of dimples and a cross-sectional shape of others thereof may be different from each other.

According to certain embodiments (not illustrated), when viewed in cross-section, the plurality of dimples are not limited to a round space or a hemispherical space, and may be implemented in various other cross-sectional shapes.

Figure 7A:
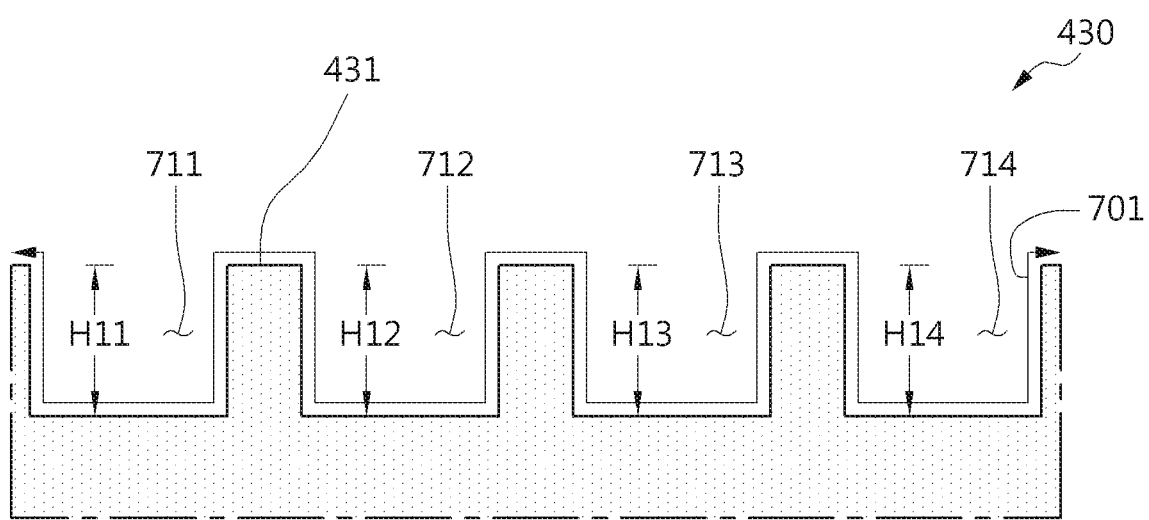
FIGS. 7A, 7B, and 7C are cross-sectional views illustrating patterns formed at a third molding surface of a core block according to certain embodiments.
Figure 7B:
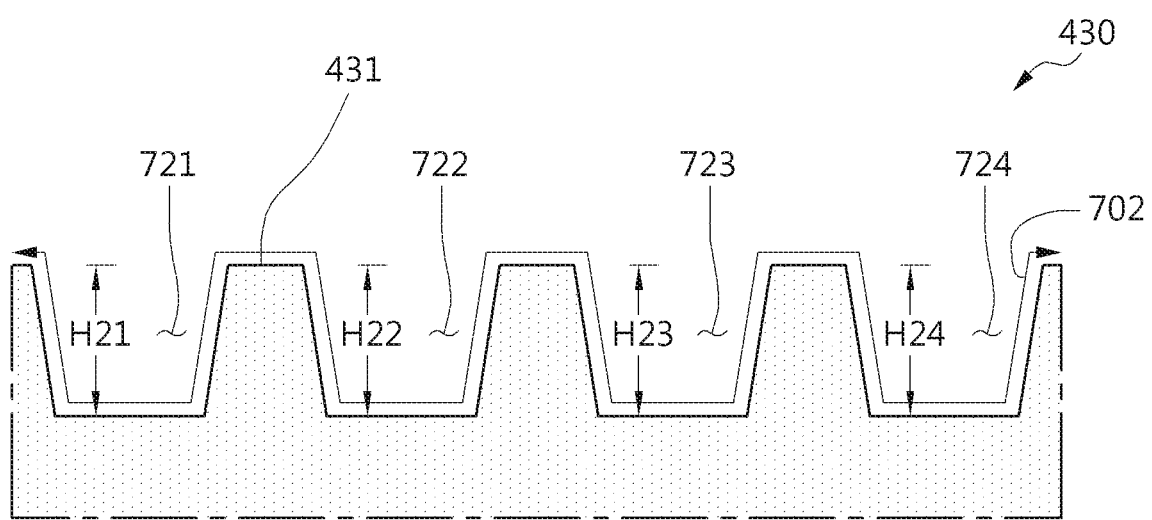
Figure 7C:
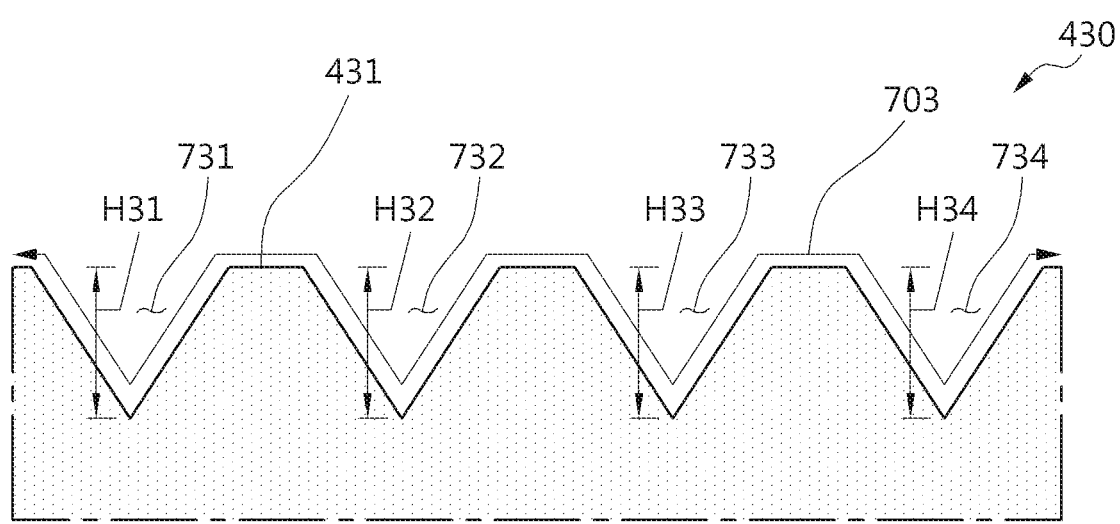

FIGS. 7A, 7B, and 7C are cross-sectional views illustrating patterns formed at a third molding surface 431 of a core block 430 according to certain embodiments.

With reference to FIG. 7A, in certain embodiments, a plurality of dimples 711, 712, 713, and 714 of a pattern 701 formed at the third molding surface 431 of the core block 430 may each be a rectangle when viewed in cross-section. With reference to FIG. 7B, in certain embodiments, a plurality of dimples 721, 722, 723, and 724 of a pattern 702 formed at the third molding surface 431 of the core block 430 may each be a trapezoid when viewed in cross-section. With reference to FIG. 7C, in certain embodiments, a plurality of dimples 731, 732, 733, and 734 of a pattern 703 formed at the third molding surface 431 of the core block 430 may each be a triangle when viewed in cross-section. According to certain embodiments, the plurality of dimples may be formed in various other cross-sectional shapes.

According to certain embodiments (not illustrated), the pattern formed at the third molding surface 431 of the core block 430 may be implemented in a form different from that of the plurality of dimples illustrated in FIG. 6, 7A, 7B, or 7C.

Figure 8:
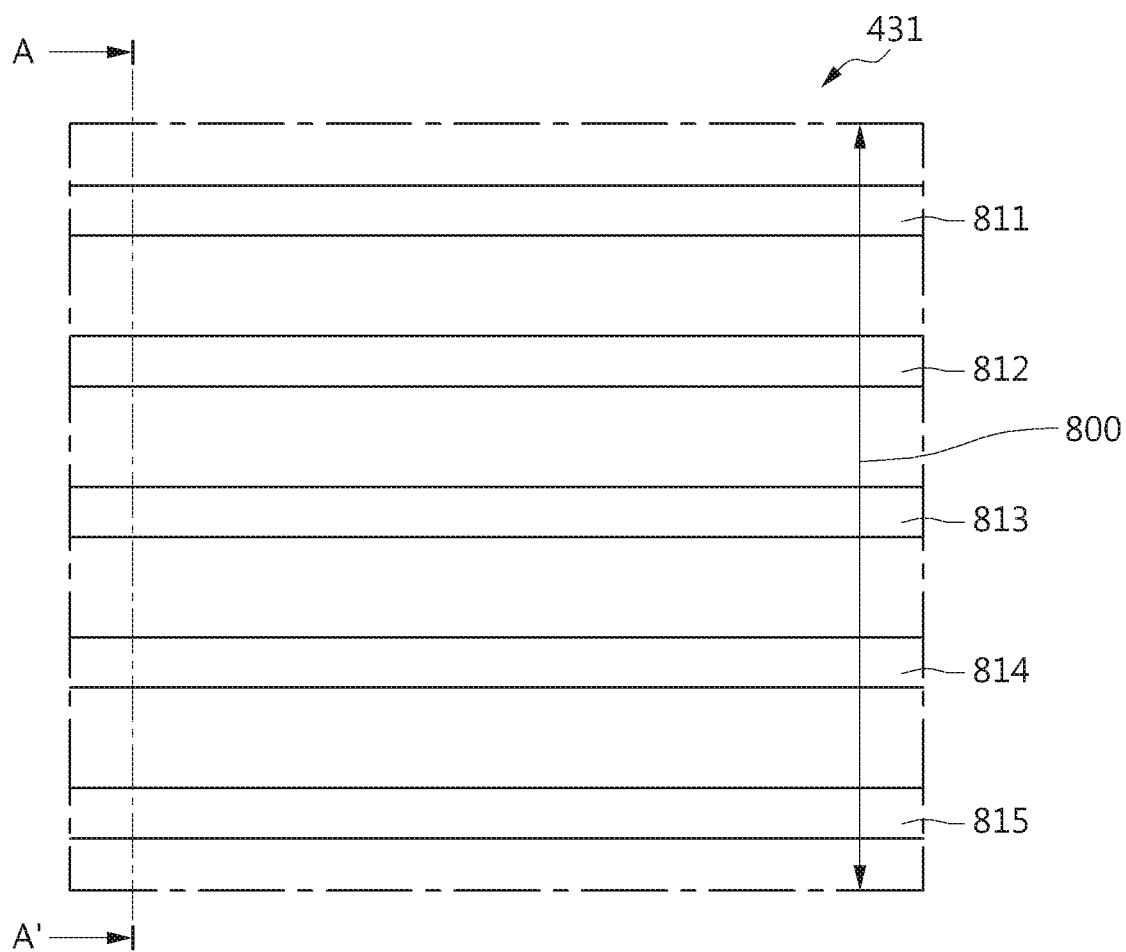
FIG. 8 is a diagram illustrating a third molding surface including a pattern according to certain embodiments.

FIG. 8 is a diagram illustrating a third molding surface 431 including a pattern 800 according to certain embodiments. With reference to FIG. 8, the pattern 800 may include a plurality of slits 811, 812, 813, 814, and 815 arranged at intervals. According to certain embodiments, when viewed in a cross-section taken along line A-A' in FIG. 8, the slit 811, 812, 813, 814, or 815 may have various cross-sectional shapes such as a rectangle, a trapezoid, or a triangle.

With reference to FIG. 6, in an embodiment, the third molding surface 431 of the core block 430 may have surface roughness having a height of about 1 µm or less by the pattern 600. For example, the depths H1, H2, H3, and H4 of the plurality of dimples 611, 612, 613, and 614 may be formed in about 1 µm or less. In certain embodiments, with reference to FIG. 7A, depths H11, H12, H13, and H14 of the plurality of dimples 711, 712, 713, and 714 are formed in about 1 µm or less, and the third molding surface 431 of the core block 430 may have surface roughness having a height of about 1 µm or less. In certain embodiments, with reference to FIG. 7B, depths H21, H22, H23, and H24 of the plurality of dimples 721, 722, 723, and 724 are formed in about 1 µm or less, and the third molding surface 431 of the core block 430 may have surface roughness having a height of about 1 µm or less. In certain embodiments, with reference to FIG. 7C, when depths H31, H32, H33, and H34 of the plurality of dimples 731, 732, 733, and 734 are formed in about 1 µm or less, the third molding surface 431 of the core block 430 may have surface roughness having a height of about 1 μm or less. In certain embodiments, with reference to FIG. 8, the depths of the plurality of slits 811, 812, 813, 814, and 815 are formed in about 1 μm or less; thus, the third molding surface 431 of the core block 430 may have surface roughness having a height of about 1 μm or less.

According to an embodiment, the pattern 600 of FIG. 6, the pattern 701 of FIG. 7A, the pattern 702 of FIG. 7B, the pattern 703 of FIG. 7C, or the pattern 800 of FIG. 8 may be formed by using a laser having a pulse width less than or equal to a preset or specified value (e.g., an interval of a time at which an amplitude becomes ½ in a rise time and a fall time of the pulse). When the plurality of dimples 611, 612, 613, and 614 of FIG. 6, the plurality of dimples 711, 712, 713, and 714 of FIG. 7A, and the plurality of dimples 721, 722, 723, and 724 of FIG. 7B, or the plurality of slits 811, 812, 813, 814, and 815 of FIG. 8 are processed using a laser having a pulse width equal to or less than the preset or specified value, occurrence of burrs may be reduced. The burr may be, for example, a residue remaining in a protruding shape around dimples or slits after forming the dimples or slits. Because the pulse width equal to or less than the preset or specified value is shorter than a heat propagation time of a material forming the core block 430, thermal damage or structural change of the material may not be caused, thereby reducing occurrence of the burr. A laser may be radiated to the core block 430 within an extremely short time, such as a pulse width equal to or less than the preset or specified value; thus, a heat diffusion phenomenon may be reduced to reduce occurrence of the burr.

According to an embodiment, a laser having a pulse width less than or equal to the preset or specified value may include a femto second laser. The femto second laser may refer to a laser having a pulse width having "ultrashort" pulses, less than a picosecond, and defined in the domain of femtoseconds ($10^{-15}$ seconds). When the plurality of dimples 611, 612, 613, and 614 of FIG. 6, the plurality of dimples 711, 712, 713, and 714 of FIG. 7A, the plurality of dimples 721, 722, 723, and 724 of FIG. 7B, or the plurality of slits 811, 812, 813, 814, and 815 of FIG. 8 are formed using a femtosecond laser, generation of burrs may be reduced. When a pattern is formed using a laser having a pulse width equal to or less than the preset or specified value, residues may be generated around the dimples or slits, but such residues may be in the form of fine powder that may be easily removed by washing.

Figure 9:
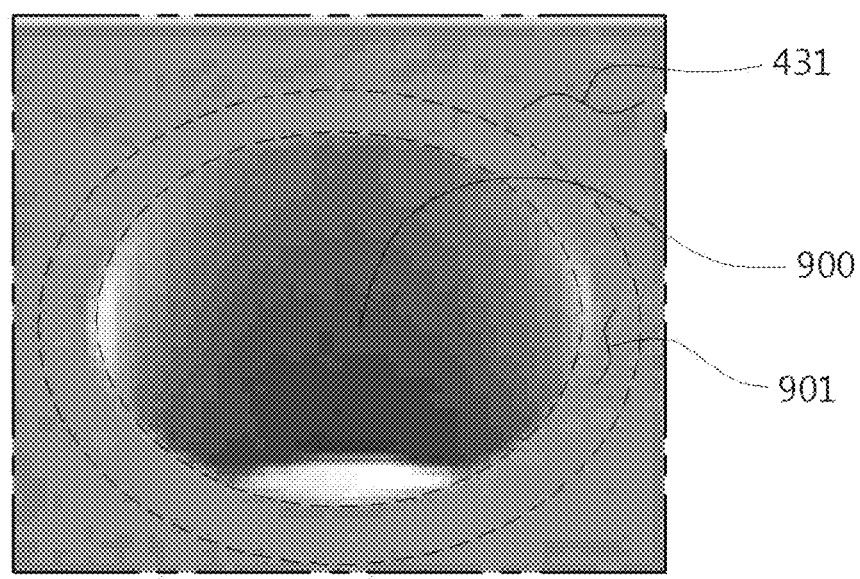
FIG. 9 is a diagram illustrating a dimple formed at a third molding surface of FIG. 5 using a laser having a pulse width equal to or less than a preset or specified value according to an embodiment.

FIG. 9 is a diagram illustrating a dimple 900 formed at the third molding surface 431 of FIG. 5 using a laser having a pulse width equal to or less than a preset or specified value according to an embodiment.

With reference to FIG. 9, when a dimple 900 is formed using a laser (e.g., femtosecond laser) having a pulse width equal to or less than a preset or specified value, residuals such as burrs may be prevented from formation in a peripheral portion 901 of the dimple 900.

According to an embodiment, when a laser (e.g., femtosecond laser) having a pulse width equal to or less than a preset or specified value is used, burrs are prevented from forming at the third molding surface 431 of the core block 430 illustrated in FIG. 5, and a pattern having surface roughness having a height of about 1 μm or less may be formed. One surface of the structure mold-injected through the die 400 of FIG. 4A may have a pattern in which the third molding surface 431 of the core block 430 is imprinted. One surface in which the pattern is disposed in the mold-injected structure may have surface roughness having a height of about 1 μm or less to correspond to the pattern of the third molding surface 431. For example, the surface roughness may be the maximum value average roughness in which a maximum height Rmax from a lowest point to a highest point is about 1 μm or less. According to an embodiment, in the mold-injected structure, one surface in which the pattern is disposed may have surface roughness of about 0.1 μm to 1 μm. In the mold-injected structure, one surface in which the pattern is disposed separates a spectrum of light according to a wavelength by a diffraction phenomenon of light to enable viewing of monochromatic lights of visible light.

For example, a dimple may be formed at the molding surface of the die using a microsecond laser. Compared with when the dimple 900 is formed using a laser (e.g., femtosecond laser) having a pulse width equal to or less than a preset or specified value according to the embodiment of FIG. 9, when a dimple is formed using a microsecond laser having a pulse width of microseconds ($10^{-6}$ seconds), residues such as burrs may be formed in a periphery of the dimple. According to certain embodiments, even when the dimple is formed using various other lasers having a pulse width greater than a preset or specified value, burrs may be formed at the periphery of the dimple.

According to certain embodiments, a pattern including dimples or slits may be formed at the molding surface of the die using various other methods, but compared with a method of using a laser having a pulse width equal to or less than a preset or specified value, the potential occurrence of burrs may be high.

For example, dimples may be formed at the molding surface of the die using chemical corrosion. Compared with when the dimple 900 is formed using a laser (e.g., femtosecond laser) having a pulse width equal to or less than a preset or specified value according to the embodiment of FIG. 9, when the dimple is formed using chemical corrosion such as etching, residues such as burrs may be formed at the periphery of the dimple.

For example, dimples may be formed at the molding surface of the die using electrical corrosion. Compared with when the dimple 900 is formed using a laser (e.g., femtosecond laser) having a pulse width equal to or less than a preset or specified value according to the embodiment of FIG. 9, when a dimple is formed at the molding surface of the die using electrical corrosion such as corrosion by electricity discharging, residues such as burrs may be formed at the periphery of the dimple.

According to an embodiment, when the pattern formed at the third molding surface 431 of the core block 430 illustrated in FIG. 5 includes burrs, the pattern imprinted in the mold-injected structure through the die 400 of FIG. 4A may have a shape rendering formation of a spectrum difficult because of the presence of burrs.

With reference to FIG. 3, according to an embodiment, in operation 330, a structure for the housing of the electronic device may be injection molded through the die (e.g., the die 400 of FIG. 4A).

The mold-injected structure may include, for example, at least one corner connecting a planar portion (or flat portion) and two curved borders that are not parallel to each other (e.g., forming an acute angle, a right angle, or an obtuse angle) and extended to be bent from the planar portion.

Figure 10:
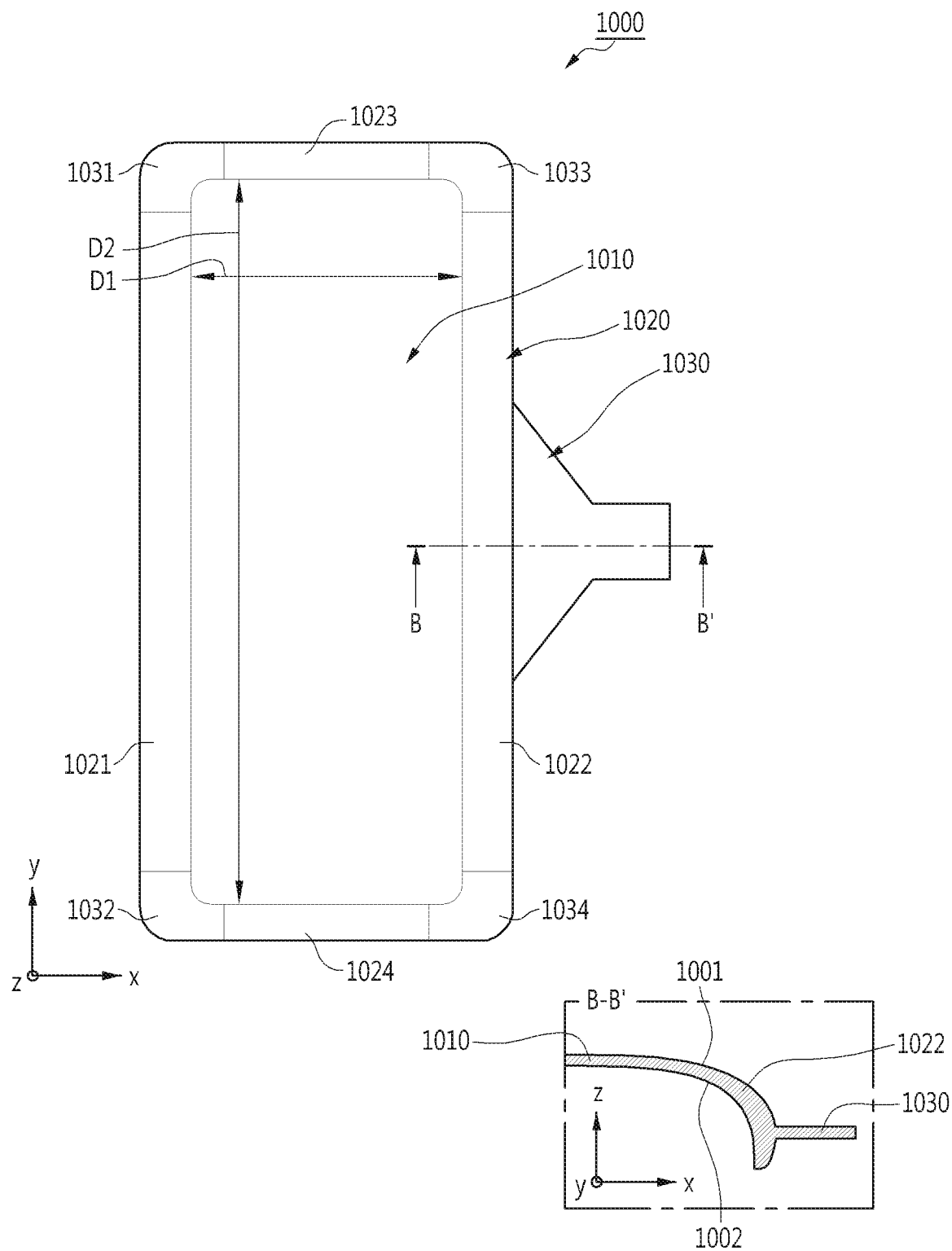
FIG. 10 is a plan view illustrating a structure mold-injected through the die of FIG. 4A according to an embodiment.

FIG. 10 is a plan view illustrating a structure 1000 that is mold-injected through the die illustrated in FIG. 4A, according to an embodiment.

With reference to FIG. 10, in an embodiment, the mold-injected structure 1000 may include a flat portion 1010 and a curved border portion 1020 extending at least partially along an edge of the flat portion 1010. With reference to FIGS. 4A, 4B, and 10, the flat portion 1010 may be formed through the flat space 510 of the molding space 500. According to an embodiment, a curved border portion 1020 may include a first curved border 1021, a second curved border 1022 disposed opposite to the first curved border 1021, a third curved border 1023 connecting one end of the first curved border 1021 and one end of the second curved border 1022, or a fourth curved border 1024 connecting the other end of the first curved border 1021 and the other end of the second curved border 1022 and disposed opposite to the third curved border 1023. With reference to FIGS. 4A, 4B, and 10, the first curved border 1021 may be formed through the first curved space 521 of the molding space 500. The second curved border 1022 may be formed through the second curved space 522 of FIG. 4A. The third curved border 1023 may be formed through the third curved space 523 of FIG. 4B. The fourth curved border 1024 may be formed through the fourth curved space 524 of FIG. 4B. When viewed from above the flat portion 1010 (e.g., viewed in the z-axis direction), the first curved border 1021 or the second curved border 1022 may be substantially orthogonal to the third curved border 1023 or the fourth curved border 1024. For example, when viewed from above the flat portion 1010, the first curved border 1021 may be parallel to the second curved border 1022, and the third curved border 1023 may be parallel to the fourth curved border 1024. According to an embodiment, when viewed from above the flat portion 1010, a first distance D1 in which the first curved border 1021 and the second curved border 1022 are spaced apart from each other may be different from a second distance D2 in which the third curved border 1023 and the fourth curved border 1024 are spaced apart from each other. For example, the first distance D1 may be smaller than the second distance D2.

According to an embodiment, the curved border portion 1020 may include a first corner 1031 seamlessly connecting the first curved border 1021 and the third curved border 1023. The curved border portion 1020 may include a second corner 1032 seamlessly connecting the first curved border 1021 and the fourth curved border 1024. The curved border portion 1020 may include a third corner 1033 seamlessly connecting the second curved border 1022 and the third curved border 1023. The curved border portion 1020 may include a fourth corner 1034 seamlessly connecting the second curved border 1022 and the fourth curved border 1024.

According to an embodiment, the mold-injected structure 1000 may include a mark (e.g., parting line (not illustrated)) formed along the die parting line 401 because of the die parting line 401 of the die 400 illustrated in FIG. 4A. According to an embodiment, the mold-injected structure 1000 may include an extension portion 1030 corresponding to the gate 450 (e.g., fan gate) of FIG. 4A disposed along at least a portion of the die parting line. At a cross-section of line B-B', the extension portion 1030 may be connected to the second curved border 1022. According to an embodiment, the extension portion 1030 may be removed through post-processing.

Figure 11:
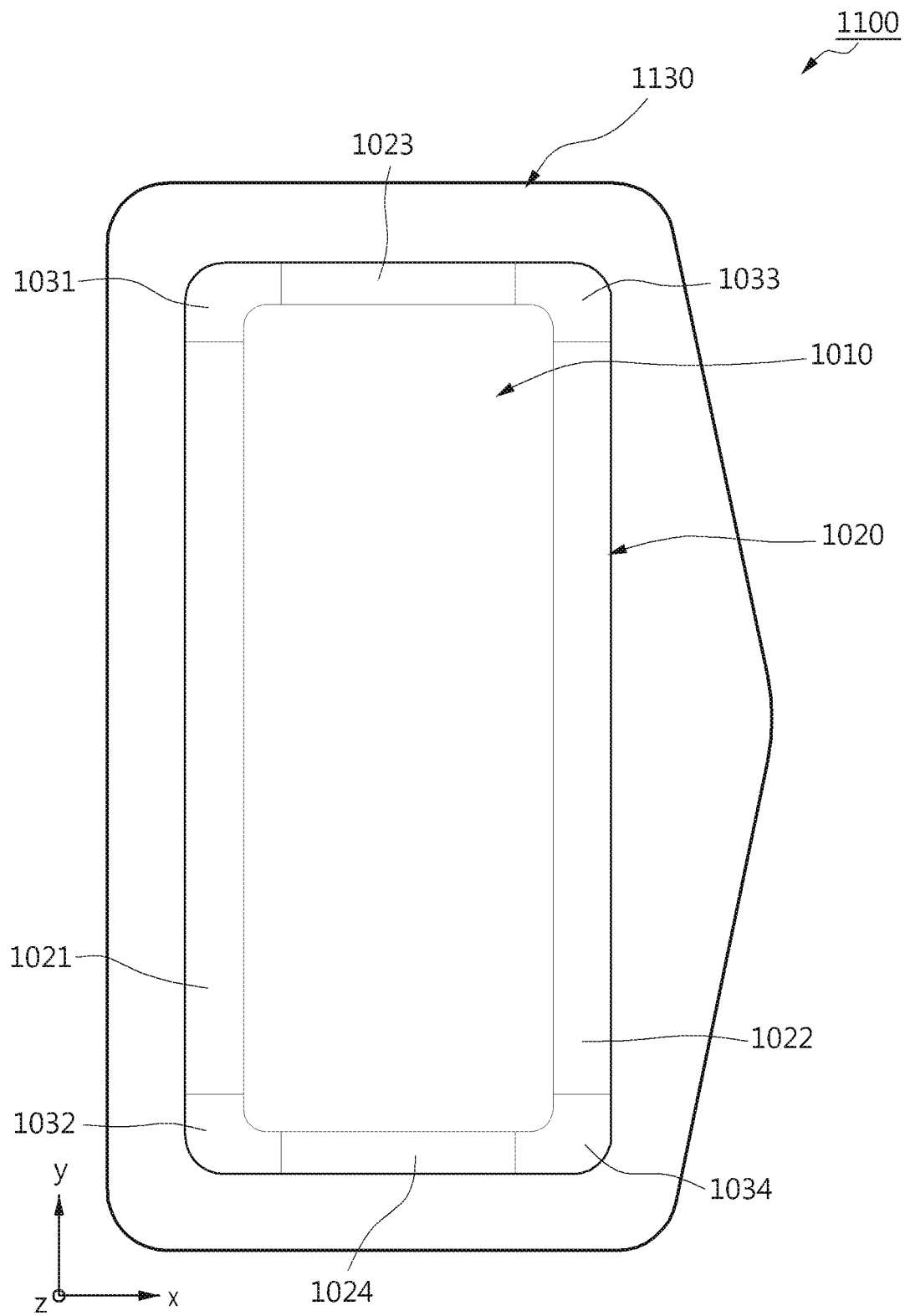
FIG. 11 is a plan view illustrating a structure mold-injected through a die according to certain embodiments.

FIG. 11 is a plan view illustrating a structure 1100 mold-injected through a die according to certain embodiments.

The die may include, for example, a space (e.g., auxiliary cavity) connected to the molding space, so as to receive an overflow of the molten resin when the resin is filled into the molding space (e.g., the molding space 500 of FIG. 4A or 4B) through a gate. With reference to FIG. 11, the structure 1100 mold-injected through the die may include an extension portion 1130 of a shape at least partially disposed along the curved border portion 1020, when viewed from above the flat portion 1010 (e.g., viewed in the z-axis direction). The extension portion 1130 may be made of the molten resin that overflows during injection molding through the die. According to certain embodiments, the die may have an injection molding structure that permits overflow while having a side gate (e.g., fan gate) such as the gate 450 of FIG. 4A. The injection molding method using overflow reduces molding defects when the structure is formed through a molding space (e.g., the molding space 500 of FIGS. 4A and 4B) of a shape having a flat space (e.g., the flat space 510 of FIGS. 4A and 4B) and curved spaces (e.g., the curved spaces 521, 522, 523, and 524 of FIGS. 4A and 4B). According to an embodiment, the extension portion 1130 may be removed through post-processing.

With reference to FIG. 3, according to an embodiment, in operation 350, post-processing of a structure mold-injected through the die may be performed.

In the embodiment of FIG. 10, the post-processing may include removing the extension portion 1030 from the mold-injected structure 1000. In the embodiment of FIG. 11, the post-processing may include removing the extension portion 1130 from the mold-injected structure 1100.

Figure 12:
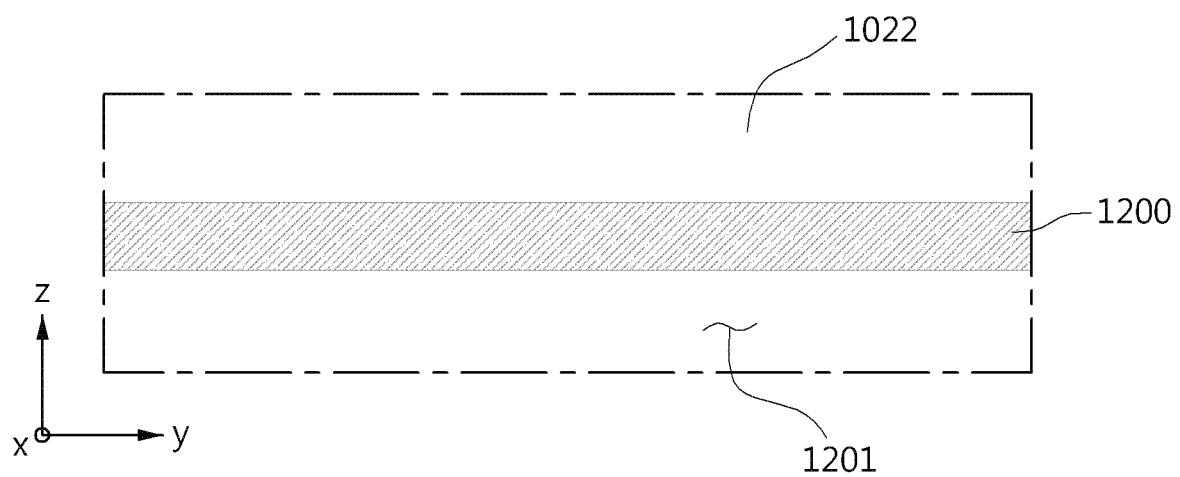
FIG. 12 is a diagram illustrating a state in which an extension portion formed by a gate of a die is removed from the structure of FIG. 10 according to an embodiment.

FIG. 12 is a diagram illustrating at least a portion of a state in which an extension portion 1030 formed by a gate of a die is removed from the structure 1000 of FIG. 10 according to an embodiment. With reference to FIGS. 10 and 12, when the extension portion 1030 is removed from the structure 1000, a trace 1200 of an area where the extension portion 1030 is removed may remain at a surface 1201 of the second curved border 1022. With reference to FIG. 10, at a cross-section of line B-B', the structure 1000 may include a first surface 1001 (e.g., the first surface 131 of FIG. 1B) and a second surface 1002 (e.g., the second surface 132 of FIG. 2) disposed opposite to the first surface 1001. According to an embodiment, in order to reduce the degree to which the trace 1200 is visible, film lamination, coating, or polishing may be performed at the first surface 1001 of the structure 1000. According to an embodiment, the second surface 1002 may have a pattern formed by imprinting a molding surface (e.g., the third molding surface 431 of FIG. 5) of the die. In order to enable light to pass through the first surface 1001 and reach the second surface 1002, a material used for film lamination or coating in relation to the trace 1200 may be selected in consideration of transparency. According to certain embodiments, even in the structure 1100 of the embodiment of FIG. 11, after removing the extension portion 1130 from the curved border portion 1020, various post-processes (e.g., film lamination, coating, or polishing) may be performed to reduce the degree to which the removal trace is visible.

Figure 13A:
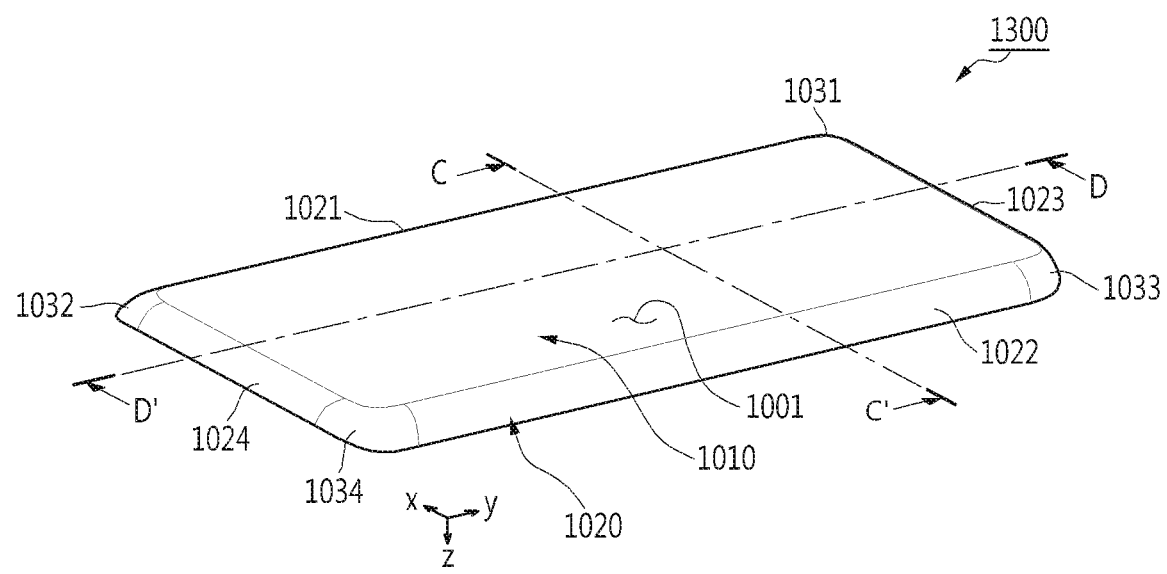
FIG. 13A is a diagram illustrating a plate formed by removing an extension portion formed by a gate of a die from the structure of FIG. 10 according to an embodiment.
Figure 13B:
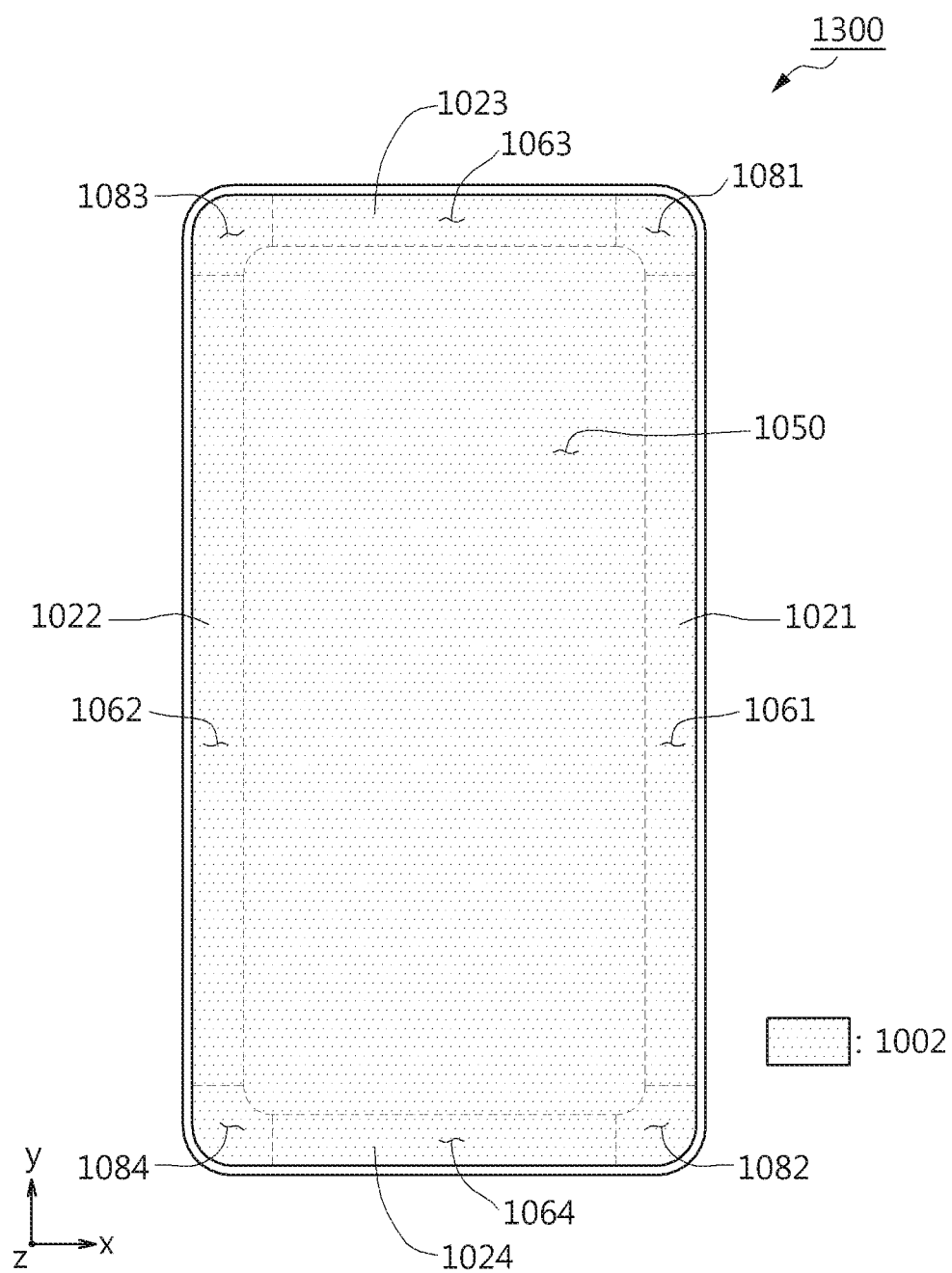
FIG. 13B is a plan view illustrating the plate of FIG. 13A according to an embodiment.

FIG. 13A is a diagram illustrating a plate 1300 formed by removing the extension portion 1030 formed by the gate of the die from the structure 1000 of FIG. 10 according to an embodiment. FIG. 13B is a plan view illustrating a plate 1300 of FIG. 13A according to an embodiment.

With reference to FIG. 13A, in an embodiment, the plate 1300 may include a flat portion 1010 and a curved border portion 1020. The curved border portion 1020 may include a first curved border 1021, second curved border 1022, third curved border 1023, fourth curved border 1024, first corner 1031, second corner 1032, third corner 1033, or fourth corner 1034.

With reference to FIGS. 1A, 1B, 2, and 13A, in an embodiment, the second housing portion 130 may be formed based on the plate 1300 of FIG. 13A, and the curved border portion 1020 may be seamlessly extended with bending from the flat portion 1010 toward the first plate 120. The plate 1300 may be formed to be substantially transparent and include, for example, various materials such as glass or polymer.

Figure 14A:
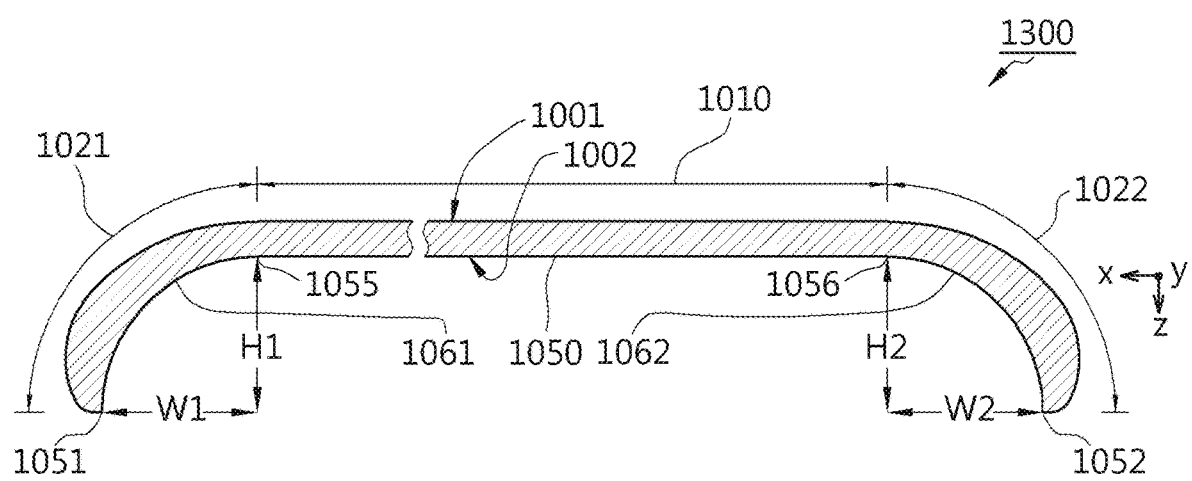
FIG. 14A is a cross-sectional view taken along line C-C' in the plate of FIG. 13A according to an embodiment.
Figure 14B:
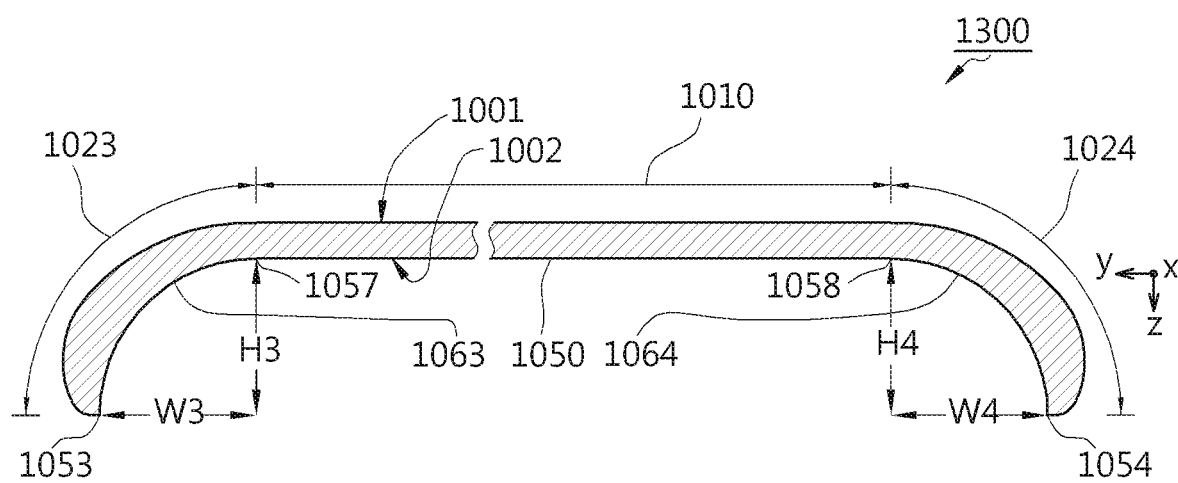
FIG. 14B is a cross-sectional view taken along line D-D' in the plate of FIG. 13A according to an embodiment.

FIG. 14A is a cross-sectional view taken along line C-C' in the plate 1300 of FIG. 13A according to an embodiment. FIG. 14B is a cross-sectional view taken along line D-D' in the plate 1300 of FIG. 13A according to an embodiment. With reference to FIGS. 13A, 13B, 14A, and 14B, in an embodiment, the plate 1300 may include a first surface 1001 and a second surface 1002 may be disposed opposite to each other. The second surface 1002 may include a first edge 1051, a second edge 1052 extended opposite to the first edge 1051, a third edge 1053 connecting one end of the first edge 1051 and one end of the second edge 1052, and a fourth edge 1054 connecting the other end of the first edge 1051 and the other end of the second edge 1052 and extended opposite to the third edge 1053. The second surface 1002 may include a first plane 1050 formed by the flat portion 1010, a first curved surface 1061 adjacent to the first edge 1051 and formed by the first curved border 1021, a second curved surface 1062 adjacent to the second edge 1052 and formed by the second curved border 1022, a third curved surface 1063 adjacent to the third edge 1053 and formed by the third curved border 1023, or a fourth curved surface 1064 adjacent to the fourth edge 1054 and formed by the fourth curved border 1024. The first plane 1050 may include a first boundary 1055 connected to a first curved surface 1061, a second boundary 1056 connected to the second curved surface 1062, a third boundary 1057 connected to a third curved surface 1063, or a fourth boundary 1058 connected to a fourth curved surface 1064. The first boundary 1055 and the second boundary 1056 may be parallel, and the third boundary 1057 and the fourth boundary 1058 may be parallel.

With reference to FIG. 14A, the first curved surface 1061 may extended, for example, from the first boundary 1055 to the first edge 1051 to seamlessly connect to the first plane 1050. According to an embodiment, the first edge 1051 may be disposed apart from the first boundary 1055 by a first height H1 in a +z axis direction, which is the direction of the first plane 1050. The first edge 1051 may be disposed apart from the first boundary 1055 by a first width W1 in the +x axis direction perpendicular to the +z axis direction. The shape of the first curved surface 1061 may vary according to a curvature of each point between the first boundary 1055 and the first edge 1051.

With reference to FIG. 14A, the second curved surface 1062 may be extended, for example, from the second boundary 1056 to the second edge 1052 to be seamlessly connected to the first plane 1050. According to an embodiment, the second edge 1052 may be disposed apart from the second boundary 1056 by a second height H2 in the +z axis direction. The second edge 1052 may be disposed apart from the second boundary 1056 by a second width W2 in the −x axis direction. According to certain embodiments, the shape of the second curved surface 1062 may vary according to a curvature of each point between the second boundary 1056 and the second edge 1052. According to an embodiment, when viewed in cross-section, the first curved surface 1061 and the second curved surface 1062 may be symmetrical with one another, and with the first plane 1050 interposed therebetween. With reference to FIG. 14B, the third curved surface 1063 may be extended, for example, from the third boundary 1057 to the third edge 1053 to seamlessly connect to the first plane 1050. According to an embodiment, the third edge 1053 may be disposed apart from the third boundary 1057 by a third height H3 in the +z axis direction. The third edge 1053 may be disposed apart from the third boundary 1057 by a third width W3 in the +y axis direction. According to certain embodiments, the shape of the third curved surface 1063 may vary according to a curvature of each point between the third boundary 1057 and the third edge 1053.

With reference to FIG. 14B, the fourth curved surface 1064 may be, for example, extended from the fourth boundary 1058 to the fourth edge 1054 to seamlessly connect to the first plane 1050. According to an embodiment, the fourth edge 1054 may be disposed apart from the fourth boundary 1058 by a fourth height H4 in the +z axis direction. The fourth edge 1054 may be disposed apart from the fourth boundary 1058 by a fourth width W4 in the −y axis direction. According to certain embodiments, the shape of the fourth curved surface 1064 may vary according to a curvature of each point between the fourth boundary 1058 and the fourth edge 1054. According to an embodiment, when viewed in cross-section, the third curved surface 1063 and the fourth curved surface 1064 may be symmetrical to one another, with the first plane 1050 interposed therebetween.

According to certain embodiments, the first height H1, the second height H2, the third height H3, or the fourth height H4 may be about 1 mm or more and 10 mm or less.

According to certain embodiments (not illustrated), at least two of the first height H1, the second height H2, the third height H3, and the fourth height H4 may be different from each other.

With reference to FIGS. 13A and 13B, in an embodiment, the second surface 1002 may include a first corner curved surface 1081 that seamlessly connects a first curved surface 1061 and a third curved surface 1063 at the first corner 1031. The second surface 1002 may include a second corner curved surface 1082 that seamlessly connects the first curved surface 1061 and a fourth curved surface 1064 at the second corner 1032. The second surface 1002 may include a third curved surface 1083 that seamlessly connects a second curved surface 1062 and the third corner curved surface 1063 at the third corner 1033. The second surface 1002 may include a fourth corner curved surface 1084 that seamlessly connects the second curved surface 1062 and the fourth curved surface 1064 at the fourth corner 1034.

With reference to FIGS. 14A and 14B, a shape of the first surface 1001 may vary according to a thickness of the plate 1300 from the first edge 1051 to the second edge 1052. A shape of the first surface 1001 may vary according to a thickness of the plate 1300 from the third edge 1053 to the fourth edge 1054.

Figure 15:
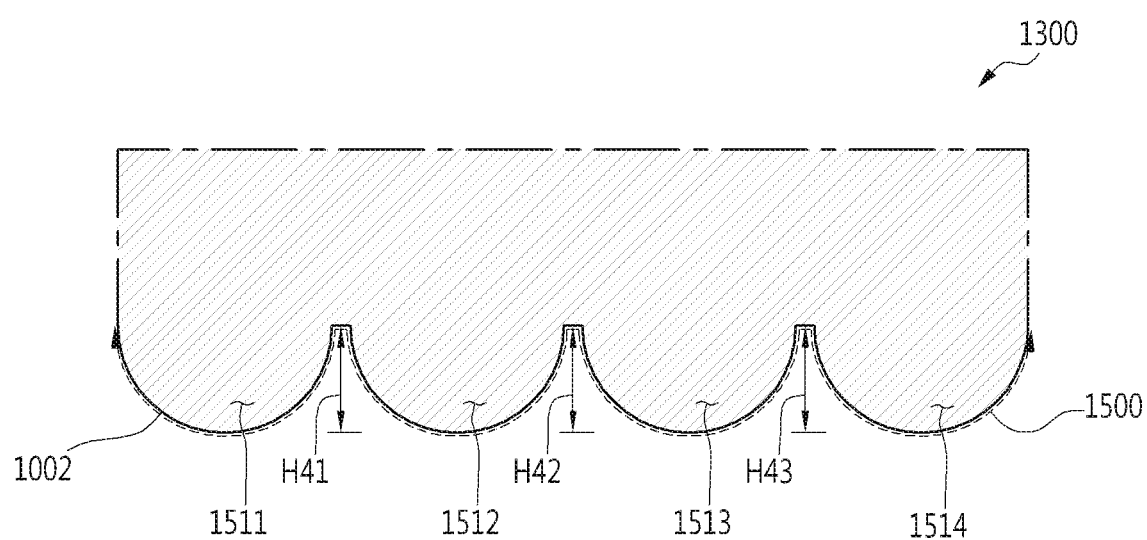
FIG. 15 is a cross-sectional view illustrating a pattern formed at a second surface of the plate of FIG. 13A according to an embodiment.

FIG. 15 is a cross-sectional view illustrating a pattern formed at the second surface 1002 of the plate 1300 of FIG. 13A according to an embodiment.

In an embodiment, with reference to FIGS. 6 and 15, the second surface 1002 of the plate 1300 may have a pattern 1500 in which the third molding surface 431 of the core block 430 is imprinted. For example, the pattern 1500 may include protrusions 1511, 1512, 1513, and 1514 having a convex shape, in a direction oriented from the first surface 1001 (see FIG. 14A or 14B) to the second surface 1002, so as to correspond to the plurality of dimples 611, 612, 613, and 614 of FIG. 6. FIG. 15 illustrates only a part of the second surface 1002, and the pattern 1500 may be formed in at least a part of the second surface 1002. For example, the pattern 1500 may be formed in at least a portion of the first plane 1050, the first curved surface 1061, the second curved surface 1062, the third curved surface 1063, the first corner curved surface 1081, the second corner curved surface 1082, the third corner curved surface 1083, and/or the fourth corner curved surface 1084 of FIG. 13B.

According to an embodiment, a pattern formed at the third molding surface 431 of the core block 430 illustrated in FIG. 5 is imprinted on the second surface 1002 of the plate 1300; thus, the second surface 1002 may have surface roughness having heights H41, H42, and H43 of about 1 μm or less.

According to an embodiment, the plate 1300 mold-injected through the die may be implemented with a material capable of passing light. When light passes through the first surface 1001 (see FIG. 14A or 14B) and reaches the second surface 1002, the pattern 1500 separates a spectrum of light according to a wavelength by a diffraction phenomenon of light to implement a visual surface texture that makes monochromatic lights of visible light visible.

According to certain embodiments, because light transmittance is higher and a haze value is lower, an amount of light passing through the first surface 1001 (see FIG. 14A or 14B) and reaching the second surface 1002 increases; thus, in consideration that it is easy to implement a visual surface texture by a spectrum, the mold-injected plate 1300 may be implemented with various materials. According to an embodiment, the mold-injected plate 1300 may have light transmittance of about 70% or more and/or a haze value of about 20% or less so that the visual surface texture by a spectrum may be visible.

With reference to FIG. 3, in certain embodiments, post-processing according to operation 330 may include processing of forming the openings 102 and 106, the microphone hole 203, the speaker hole 207, and/or the connector holes 108 and 109 of FIG. 2 in the plate 1300 of FIG. 13A.

With reference to FIG. 3, in certain embodiments, post-processing according to operation 330 may include processing of disposing various layers at the second surface 1002 of the plate 1300 illustrated in FIG. 13B.

Figure 16:
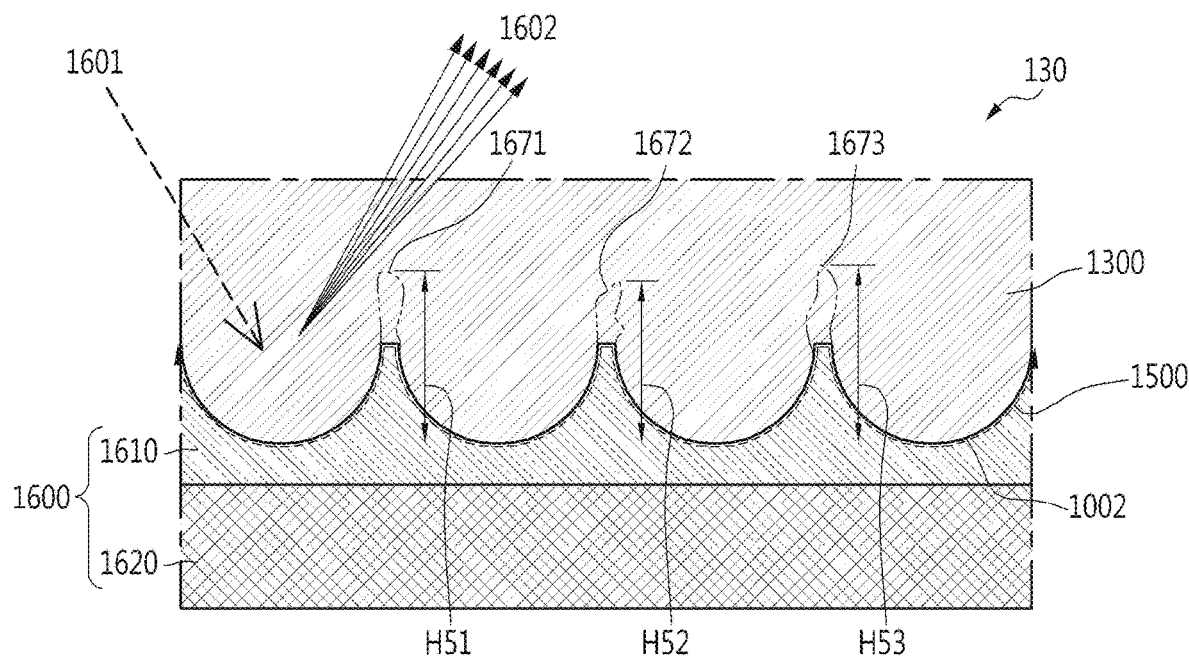
FIG. 16 is a cross-sectional view illustrating a second housing portion of FIG. 2 according to an embodiment.

FIG. 16 is a cross-sectional view illustrating the second housing portion 130 of FIG. 2 according to an embodiment.

With reference to FIG. 16, the second housing portion 130 may include a plate 1300 and a decoration layer 1600 disposed at the second surface 1002 of the plate 1300 to provide a visual effect. According to an embodiment, the decoration layer 1600 may include at least one layer, for example, a first color layer 1610 and/or a second color layer 1620.

According to an embodiment, the first color layer 1610 is a translucent thin film layer and may implement a color. According to certain embodiments, the first color layer 1610 may serve to increase surface reflectivity. For example, the first color layer 1610 may be disposed at the second surface 1002 of the plate 1300 through various deposition methods such as physical vapor deposition (PVD). Physical vapor deposition may vaporize various metal materials such as indium, titanium oxide, aluminum oxide, or silicon oxide in a vacuum, thereby coating vaporized metal atoms on the second surface 1002 of the plate 1300.

According to an embodiment, the second color layer 1620 is an opaque thin film layer and may implement a color. A color of the second color layer 1620 may make a color of the first color layer 1610 appear darker. When the second housing portion 130 is disposed at the electronic device (e.g., the electronic device 100 of FIG. 1A), the second color layer 1620 may serve as a shield to hide the inside of the electronic device.

According to certain embodiments, at least one layer included in the decoration layer 1600 may include various materials for shielding electromagnetic waves (e.g., EMI shielding).

According to certain embodiments (not illustrated), the second housing portion 130 may further include various other layers, or some layers may be omitted. According to certain embodiments (not illustrated), the second housing portion 130 may be disposed at the first surface 1001 (see FIGS. 14A and 14B) of the plate 1300 to include various layers for visual effects (see FIG. 12). According to certain embodiments (not illustrated), the stacking order of the first color layer 1610 and the second color layer 1620 may be changed.

According to certain embodiments (not illustrated), the second housing portion 130 may have a plurality of first color layers or a plurality of second color layers.

According to an embodiment, when light 1601 passes through the first surface 1001 (see FIG. 14A or 14B) to reach the second surface 1002, or an interface between the plate 1300 and the decoration layer 1600, the pattern 1500 (e.g., diffraction grating) formed at the second surface 1002 separates a spectrum of light according to a wavelength by a diffraction phenomenon of light to implement a visual surface texture that makes monochromatic lights 1602 of visible light visible. Because of a thickness between the first surface 1001 and the second surface 1002 and the pattern 1500 formed at the second surface 1002, a visual surface texture having a sense of depth may be visible.

According to certain embodiments, a material of the plate 1300 and/or the decoration layer 1600 may be selected in consideration of a refractive index between the plate 1300 and the decoration layer 1600. As the refractive index difference between the plate 1300 and the decoration layer 1600 increases, reflectivity of the interface between the plate 1300 and the decoration layer 1600 may increase. For example, as reflectivity of the interface between the plate 1300 and the decoration layer 1600 increases, an amount of light reflected and/or diffracted at the interface increases, thereby making it easier to implement a visual surface texture. According to certain embodiments, at least a portion of the decoration layer 1600 may include various reflective materials.

According to an embodiment, when the pattern formed at the third molding surface 431 of the core block 430 illustrated in FIG. 5 includes burrs, the pattern 1500 of the second surface 1002 of the plate 1300 in which the pattern formed at the third molding surface 431 is imprinted may include pattern shapes 1671, 1672, and 1673 by the burrs. These pattern shapes 1671, 1672, and 1673 may make formation of a spectrum difficult. Further, the pattern shapes due to the burrs may enable the second surface 1002 to have surface roughness in which heights H51, H52, and H53 exceed about 1 μm.

Figure 17:
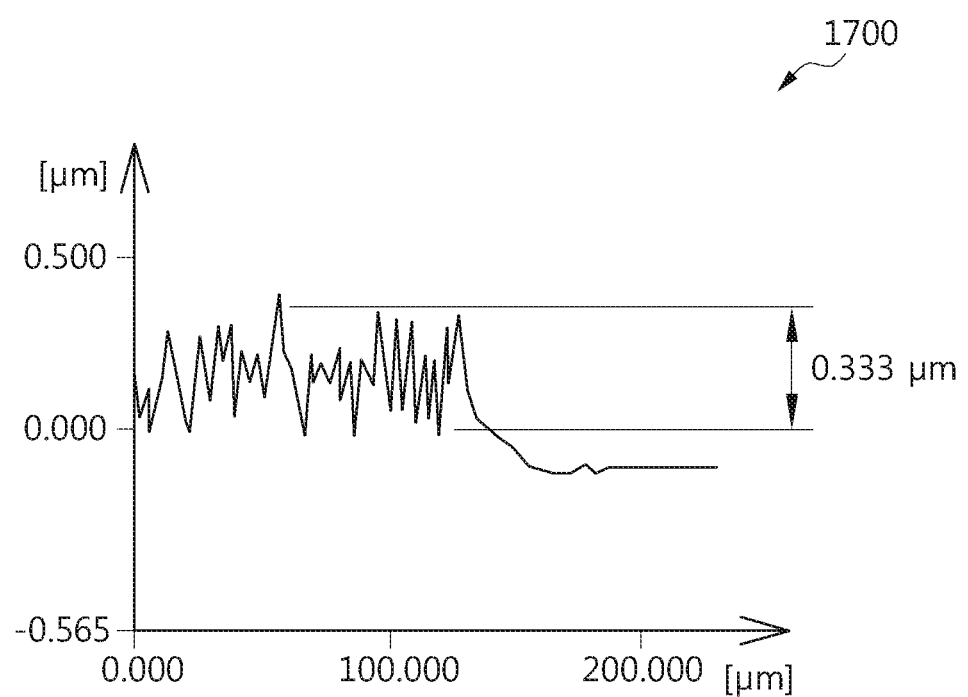
FIG. 17 is a graph illustrating a cross-sectional curve of the plate of FIG. 13A according to an embodiment.

FIG. 17 is a diagram illustrating a cross-sectional curve 1700 of the plate 1300 of FIG. 13A according to an embodiment. With reference to FIG. 17, a pattern (e.g., the pattern 1500 of FIG. 15) formed at the second surface 1002 (see FIG. 13A) of the plate 1300 may have surface roughness having a height of about 1 μm or less (e.g., about 0.333 μm).

Figure 18A:
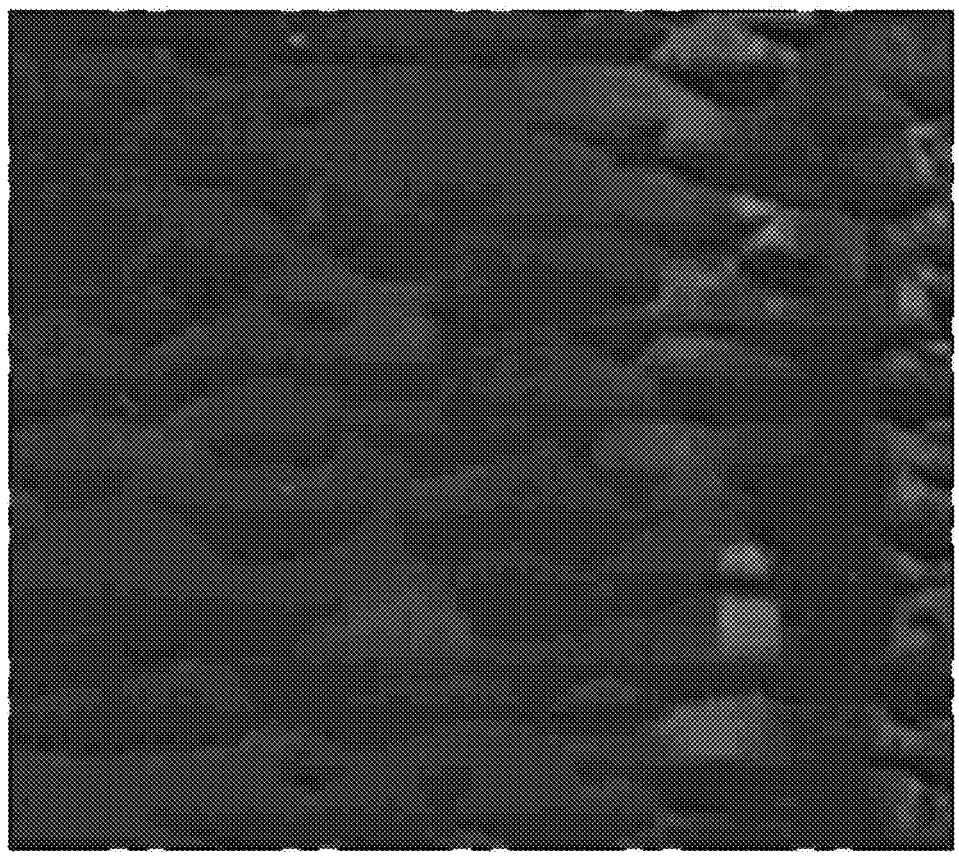
FIGS. 18A, 18B, and 18C are diagrams illustrating various visual surface textures viewed through the second housing portion of FIG. 2 according to certain embodiments.
Figure 18B:
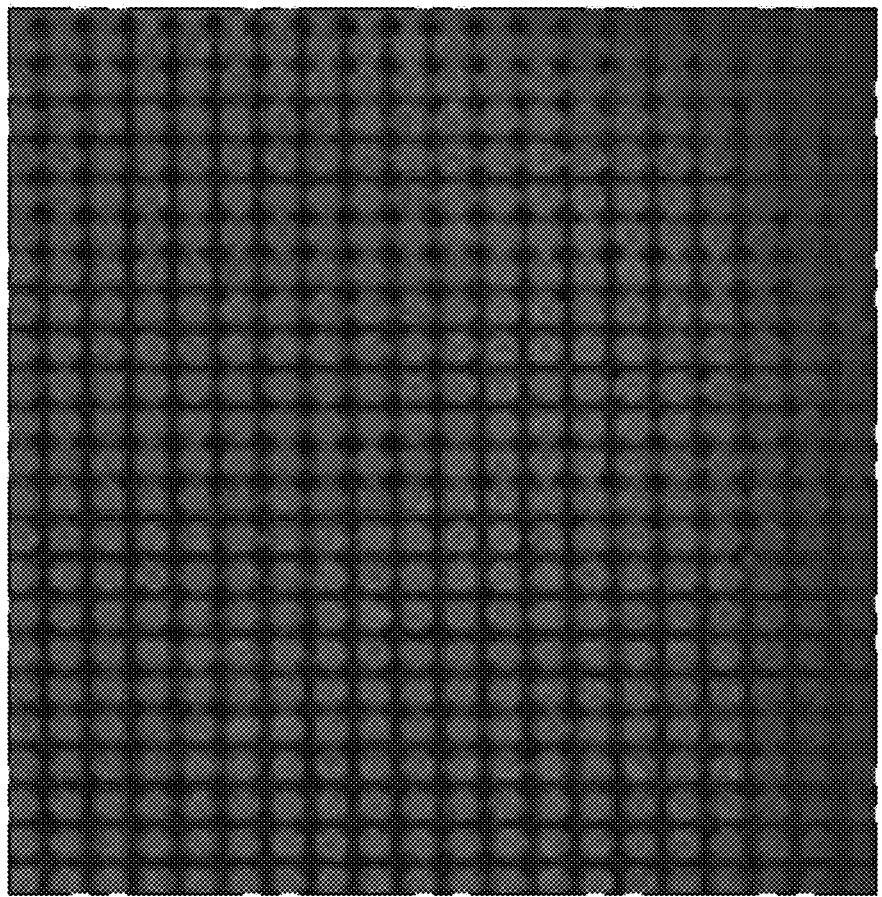
Figure 18C:
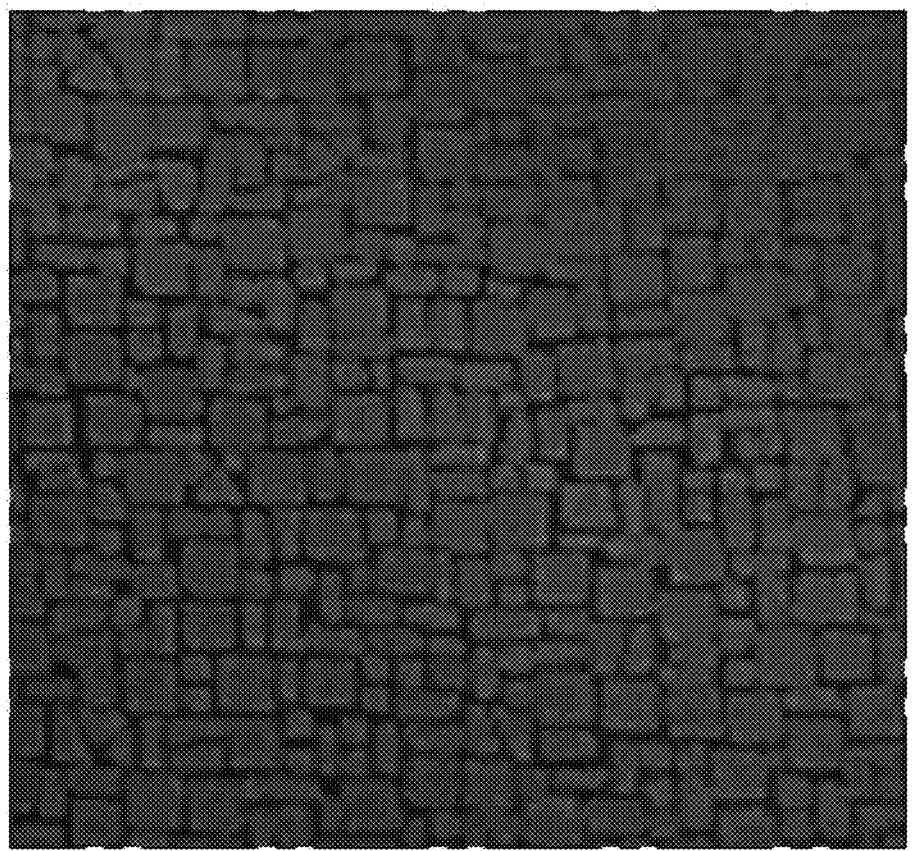

FIGS. 18A, 18B, and 18C are diagrams illustrating various visual surface textures viewed through the second housing portion 130 of FIG. 2 according to certain embodiments.

According to certain embodiments, the pattern formed at the second surface 1002 of the plate 1300 illustrated in FIG.

13B may vary according to a pattern formed at the molding surface of the die. Based on various patterns formed at the second surface 1002 of the plate 1300 illustrated in FIG. 13B, various visual surface textures through a spectrum may be viewed as illustrated in FIG. 18A, 18B, or 18C.

For example, when dimples are formed at the molding surface of the die using corrosion (e.g., chemical corrosion or electrical corrosion) or a laser (e.g., microsecond laser or nanosecond laser) with a pulse width greater than a preset or specified value, residues such as burrs may be formed at the periphery of the dimple. A surface of the structure on which the molded surface is imprinted through injection molding may have difficulty in separating a spectrum of light according to a wavelength because of the burrs.

According to certain embodiments (not illustrated), with reference to FIGS. 4A and 4B, a pattern (e.g., the pattern 600 of FIG. 6, the pattern 701 of FIG. 7A, the pattern 702 of FIG. 7B, the pattern 703 of FIG. 7C, or the pattern 800 of FIG. 8) may be formed in at least a portion of the first molding surface 411 and the second molding surface 421 of the die 400. The first surface 1001 of the plate (e.g., the plate 1300 of FIG. 16) mold-injected through the die 400 may have a pattern in which the first molding surface 411 and/or the second molding surface 421 is imprinted. Various layers such as the decoration layer 1600 of FIG. 16 may be disposed at the first surface 1001. A visual surface texture in which monochromatic lights of visible light are visible may be implemented through the first surface 1001 including the pattern.

According to certain embodiments (not illustrated), the disclosure is not limited to a method in which the pattern is imprinted in the structure mold-injected based on a pattern (e.g., the pattern 600 of FIG. 6, the pattern 701 of FIG. 7A, the pattern 702 of FIG. 7B, the pattern 703 of FIG. 7C, or the pattern 800 of FIG. 8) formed at the molding surface of the die, and the pattern may be directly formed at the surface of the structure. For example, a pattern may be formed using a laser (e.g., femtosecond laser) having a pulse width equal to or less than a preset or specified value at the surface of the structure. When using a laser having a pulse width equal to or less than the preset or specified value, a pattern for facilitating a spectrum by reducing occurrence of burrs may be formed. A surface of a structure having a pattern formed using a laser having a pulse width less than or equal to the preset or specified value may have surface roughness forming a height of about 1 μm or less.

As an example, the housing forming an external shape of the electronic device may be produced by a method of forming a UV molding layer having a fine pattern at the surface of the structure through UV molding. However, when the surface of the structure is not a flat shape, such as having edges or corners where several surfaces meet, it may be difficult to perform rolling that uniformly spreads a UV molding liquid (e.g., UV curable resin) at the surface during UV molding.

As another example, the housing may be produced by laminating a layer having a fine pattern through UV molding and various other layers on a sheet (e.g., a plate material to be a basis for disposing layers) and then thermoforming through the die. However, it may be difficult to secure a yield because of poor dimensional stability such as shape deformation in thermoforming. Further, when a shape such as an edge or a corner where several surfaces meet is formed, a crack may easily occur.

As another example, the housing may be produced by attaching a film having a fine pattern to the structure. However, the surface of the structure may have edges or corners where several surfaces meet, and when the flat film is bonded to the surface, the film may not adhere evenly at the edges or corners, resulting in bonding defects such as folding or wrinkles.

As another example, the housing may be produced by disposing a film having a fine pattern in the die and then injecting a resin to form a member bonded to the film. However, when the flat film is deformed into a shape having edges or corners where several surfaces meet in the die, defects such as folding may occur.

According to an embodiment, the housing (e.g., the second housing portion 130 of FIG. 2) may not use a film having a fine pattern or a layer through UV molding and may have a fine pattern for a visual surface texture without restrictions on the surface shape of the housing.

Figure 19:
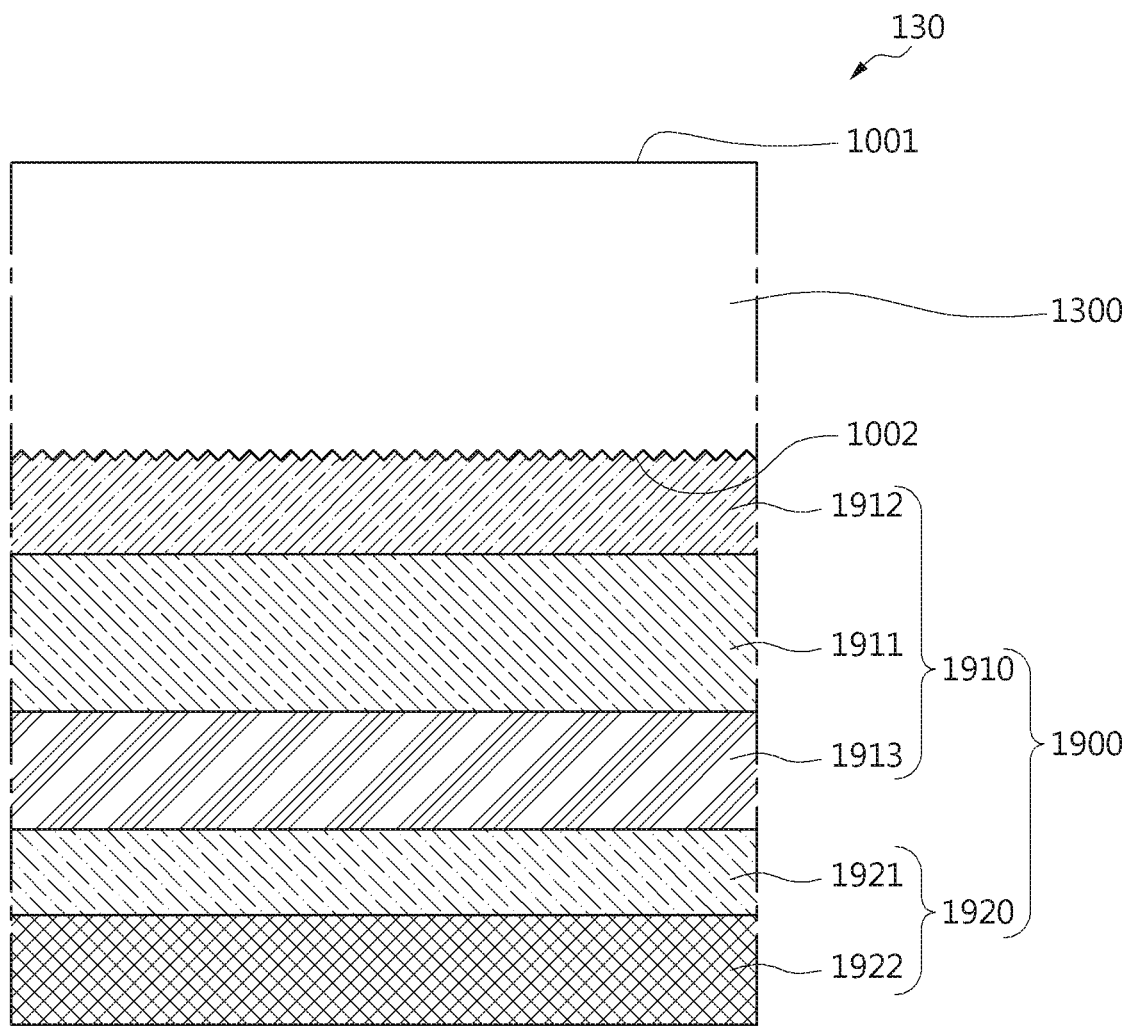
FIG. 19 is a cross-sectional view illustrating a second housing portion of FIG. 2 according to another embodiment.

FIG. 19 is a cross-sectional view illustrating the second housing portion 130 of FIG. 2 according to another embodiment.

With reference to FIG. 19, for example, the second housing portion 130 may include a plate 1300 and a decoration layer 1900 disposed at the second surface 1002 of the plate 1300 to provide a visual effect. According to an embodiment, the decoration layer 1900 may include a first layer 1910 and/or a second layer 1920. The first layer 1910 may be positioned between the plate 1300 and the second layer 1920. When light is incident on the first surface 1001, various visual effects by the plate 1300, the first layer 1910, and/or the second layer 1920 may be provided to the user. "Visual effect is provided to the user" may be understood as "visual effect is perceived by the user or transferred to the user". The visual effect may include, for example, various visual characteristics such as a visual texture (or visual surface texture), a visual pattern, or a visual color that the user feels for the second housing portion 130 when viewed toward the first surface 1001. When light is incident on the first surface 1001, various visual effects may be provided to the user because of medium characteristics of a structure (e.g., layer structure) formed with a plurality of layers included in the second housing portion 130. The visual effect may be, for example, implemented in various ways based on various light phenomena in which light incident on the first surface 1001 is reflected, refracted, scattered, or dispersed by the layer structure of the second housing portion 130. The visual effect may be variously implemented based on, for example, light transmittance and refractive index of each layer, and reflectivity at an interface between layers.

According to an embodiment, after a laminated film including the first layer 1910 and the second layer 1920 is produced, the laminated film may be bonded to the plate 1300. According to some embodiments, after the laminated film including the first layer 1910 is bonded to the plate, the second layer 1920 may be disposed at the laminated film.

According to an embodiment, the second surface 1002 of the plate 1300 may include a first pattern (e.g., the pattern 1500 of FIG. 15) for separating a spectrum of light according to a wavelength to implement a visual effect that enables viewing of monochromatic lights of visible light. The first pattern included in the second surface 1002 may imprint, for example, a pattern formed at the third molding surface 431 of the core block 430 illustrated in FIG. 5, thereby having surface roughness of about 1 μm or less. When light passes through the first surface 1001 and reaches the second surface 1002 or the interface between the plate 1300 and the first layer 1910, a first pattern (e.g., diffraction grating) formed at the second surface 1002 may provide a user with a first visual texture that enables viewing of monochromatic lights of visible light by separating a spectrum of light according to a wavelength. Because of a thickness between the first surface 1001 and the second surface 1002, and a first pattern formed at the second surface 1002, a first visual texture may be provided to the user with a sense of depth. The sense of depth may be defined as perception of a distance (e.g., distance perception or depth perception) in which a visual effect such as a visual texture or a visual pattern is visually transferred to a user.

According to an embodiment, the first layer 1910 may include a base film 1911, a transparent adhesive layer 1912, and a pattern layer 1913. The transparent adhesive layer 1912 may be positioned between the plate 1300 and the base film 1911. The base film 1911 may be positioned between the transparent adhesive layer 1912 and the pattern layer 1913.

According to certain embodiments (not illustrated), a primer may be positioned between the plate 1300 and the transparent adhesive layer 1912. After applying a primer to the second surface 1002 of the plate 1300, the first layer 1910 may be bonded to the primer. The plate 1300 and the transparent adhesive layer 1912 may be bonded to each other without gaps or bubbles by the primer. The primer may be, for example, formed in a thin film of about 1 μm or less having a shape following the first pattern (e.g., the pattern 1500 of FIG. 15) of the second surface 1002 of the plate 1300. The primer may include a material having bonding affinity with the plate 1300 and the transparent adhesive layer 1912. According to certain embodiments, the primer may have a color, and when light is incident on the first surface 1001, a visually unique color of the second housing portion 130 may be implemented by the primer.

The base film 1911 is, for example, a film that serves as a basis for disposing at least one layer, and may be, for example, formed with various polymers such as polycarbonate (PC) or polyethylene terephthalate (PET). The base film (or polymer film) 1911 may include a substantially transparent or translucent material. A transparent adhesive layer 1912 for bonding to the plate 1300 may be disposed at one surface of the base film 1911, and the pattern layer 1913 may be disposed at the other surface of the base film 1911. The visual effect by the first layer 1910 may be substantially implemented by the pattern layer 1913.

According to an embodiment, the pattern layer 1913 may be formed through UV molding. For example, the pattern layer 1913 (e.g., UV molding layer) may be formed by injecting an ultraviolet curable resin into the die to which a pattern is applied, placing and pressing the base film 1911 on the die to which an ultraviolet curable resin is injected, and radiating and curing ultraviolet rays. The UV molding layer may have a second pattern in which a die pattern (e.g., uneven pattern) is substantially imprinted. The second pattern may include, for example, an uneven surface including a plurality of dimples or a plurality of slits. The second pattern of the UV molding layer may be, for example, positioned at an interface between the first layer 1910 and the second layer 1920. The visual effect (e.g., visual color) implemented by the second layer 1920 may be transferred to the user by adding a visual texture (or visual pattern) by the second pattern. According to an embodiment, a first visual texture by the second surface 1002 of the plate 1300 and a second visual texture by the second layer 1920 may be added and transferred to the user. The first visual texture and the second visual texture may be transferred to the user with different senses of depth. According to certain embodiments, the pattern layer 1913 may replace the UV molding layer or may further include at least one added another molding layer. The other molding layer may be a molding layer cured by using ultraviolet rays or light of various other bands.

According to some embodiments (not illustrated), a primer may be positioned between the base film 1911 and the UV molding layer (e.g., the pattern layer 1913). For example, a molding layer (e.g., UV molding layer) including a second pattern may be formed by applying a primer to the base film 1911, applying a photocurable resin to the primer, and radiating light (e.g., ultraviolet rays) in a designated band to a photocurable resin. The base film 1911 and the UV molding layer may be bonded without gaps or bubbles by the primer. The primer may include a material having bonding affinity with the base film 1911 and the UV molding layer.

According to certain embodiments, the second pattern of the UV molding layer (e.g., the pattern layer 1913) may implement a visual texture that enables viewing of monochromatic lights of visible light by separating a spectrum of light according to a wavelength by a diffraction phenomenon of light. When light passes through the first surface 1001 and reaches an interface between the UV molding layer and the second layer 1920, the second pattern (e.g., diffraction grating) formed at the interface may implement a visual texture that enables viewing of monochromatic lights of visible light by separating a spectrum of light according to a wavelength by a diffraction phenomenon of light.

According to certain embodiments, the pattern layer 1913 may include a gradient pattern for a visual effect of the gradient. For example, the gradient pattern may be printed on the base film 1911.

According to certain embodiments, the pattern layer 1913 may include a UV molding layer and a layer including a gradient pattern. The layer including the gradient pattern may be, for example, positioned between the base film 1911 and the UV molding layer. The second pattern of the UV molding layer may be positioned at an interface between the first layer 1910 and the second layer 1920.

The transparent adhesive layer 1912 may include, for example, an optically transparent adhesive material such as an optical clear adhesive (OCA). When the first layer 1910 is bonded to the plate 1300, a release film protecting the transparent adhesive layer 1912 may be separated, thereby exposing the transparent adhesive layer 1912. The transparent adhesive layer 1912 may reduce an air gap between the plate 1300 and the base film 1911. For example, when there is an air gap between the plate 1300 and the base film 1911, deformation or loss of light may occur because of the difference in refractive index between different media (e.g., the plate 1300, air gap, and the base film 1911); thus, a quality of the visual effect by the plate 1300, the first layer 1910, and/or the second layer 1920 may be deteriorated. According to an embodiment, when the plate 1300 and the first layer 1910 are coupled without an air gap because of the transparent adhesive layer 1912, the difference in refractive index between the transparent adhesive layer 1912 and a medium layer in contact therewith may be reduced; thus, reflectivity of the interface between the transparent adhesive layer 1912 and the medium layer in contact therewith may be deteriorated. Accordingly, it is possible to reduce reflection at the interface and deformation or loss of light resulting therefrom, thereby securing a quality of the visual effect by the plate 1300, the first layer 1910, and/or the second layer 1920.

According to certain embodiments, when the plate 1300 and the first layer 1910 are bonded, in order to reduce generation of bubbles because of surface roughness of the second surface 1002 of the plate 1300 (e.g., uneven surface having surface roughness of about 1 μm or less), the transparent adhesive layer 1912 may use a liquid adhesive such as an optical clear resin (OCR) or a super view resin (SVR).

According to an embodiment, the second layer 1920 may include a first color layer 1921 and/or a second color layer 1922.

The first color layer 1921 (e.g., the first color layer 1610 of FIG. 16) may implement, for example, a color as a translucent thin film layer. According to certain embodiments, the first color layer 1921 may serve to increase surface reflectivity. For example, the first color layer 1921 may be disposed at the first layer 1910 through various deposition methods such as physical vapor deposition (PVD). In the physical vapor deposition, various metal materials such as indium, titanium oxide, aluminum oxide, or silicon oxide may be vaporized in a vacuum so that vaporized metal atoms may be coated on the surface of the first layer 1910.

The second color layer 1922 (e.g., the second color layer 1620 of FIG. 16) may implement, for example, a color as an opaque thin film layer. The color of the second color layer 1922 may make the color of the first color layer 1921 appear darker. When the second housing portion 130 is disposed at the electronic device (e.g., the electronic device 100 of FIG. 1A), the second color layer 1922 may serve as a shield to prevent the inside of the electronic device from being viewed.

According to certain embodiments (not illustrated), the second plate 130 may further include various other layers, or some layers may be omitted. According to certain embodiments (not illustrated), the second plate 130 may be disposed at the first surface 1001 (see FIGS. 14A and 14B) of the plate 1300 to include various layers for visual effects (see FIG. 12). According to certain embodiments (not illustrated), the stacking order of the first color layer 1921 and the second color layer 1922 may be changed.

According to certain embodiments, at least one of a plurality of layers between the first surface 1001 and the second layer 1920 may have a color. "Have a color" may be understood as the opposite concept of "be colorless or transparent that can transfer or pass all or most of the colors". When light is incident on the first surface 1001, a color of at least one layer may be visually provided to the user.

According to an embodiment of the disclosure, an electronic device (e.g., the electronic device of FIG. 1A) may include a housing (e.g., the housing 110 of FIG. 1A or 1B) including a front surface (e.g., the front surface 110A of FIG. 1A), a rear surface (e.g., the rear surface 110B of FIG. 1B), and a side surface (e.g., the side surface 110C of FIG. 1A or 1B) enclosing a space between the front surface and the rear surface. The housing may include a first plate (e.g., the first plate 120 of FIG. 2) forming the front surface. The housing may include a second plate (e.g., the second plate 130 of FIG. 2) integrally extended from the side surface to the rear surface. The electronic device may include a display (e.g., the display 101 of FIG. 2) disposed in the space and at least partially visible through the first plate. The second plate may include a first surface (e.g., the first surface 131 of FIG. 1B) forming the side surface and the rear surface and a second surface (e.g., the second surface 132 of FIG. 1B) disposed opposite to the first surface. At least a portion of the second surface (e.g., the second surface 1002 of FIG. 15) may include a pattern (e.g., the pattern 1500 of FIG. 15 or 16) having surface roughness having a height of 0.1 μm to 1 μm.

According to an embodiment of the disclosure, the pattern (e.g., the pattern 1500 of FIG. 15 or 16) may include a plurality of dimples or a plurality of slits.

According to an embodiment of the disclosure, the second plate (e.g., the plate 1300 of FIG. 13A) may have light transmittance of 70% to 100%.

According to an embodiment of the disclosure, the second plate (e.g., the plate 1300 of FIG. 13A) may have a haze value of 0% to 20%.

According to an embodiment of the disclosure, the second plate (e.g., the plate 1300 of FIG. 13A) including the pattern (e.g., the pattern 1500 of FIG. 15 or 16) may include a parting line formed at least partially along the side surface (e.g., the side surface 110C of FIG. 1A) based on a die parting line (e.g., the die parting line 401 of FIG. 4A).

According to an embodiment of the disclosure, the side surface (e.g., the surface 1201 of FIG. 12) may include a trace (e.g., the trace 1200 of FIG. 12) in which an injection portion molded at a gate (e.g., the gate 450 of FIG. 4A) of the die is removed on the parting line.

According to an embodiment of the disclosure, the second plate (e.g., the second housing portion 130 of FIG. 16) may further include a transparent layer disposed at the first surface (e.g., the first surface 131 of FIG. 1B) to cover the trace (e.g., the trace 1200 of FIG. 12).

According to an embodiment of the disclosure, the pattern (e.g., the pattern 1500 of FIG. 15 or 16) of the second surface may be formed by imprinting a pattern (e.g., the pattern 600 of FIG. 6, the pattern 701 of FIG. 7A, the pattern 702 of FIG. 7B, the pattern 703 of FIG. 7C, or the pattern 800 of FIG. 8) formed in a die (e.g., the die 400 of FIG. 4A) using a laser having a pulse width equal to or less than a preset or specified value.

According to an embodiment of the disclosure, the laser having a pulse width equal to or less than the preset or specified value may include a femto second laser having an ultrashort pulse width expressed primarily via femtoseconds ($10^{-15}$ seconds).

According to an embodiment of the disclosure, the second plate (e.g., the second housing portion 130 of FIG. 16) may further include at least one color layer (e.g., the decoration layer 1600 of FIG. 16) disposed at the second surface.

According to another embodiment of the disclosure, the second plate (e.g., the housing portion 130 of FIG. 19) may further include a first layer (e.g., the first layer 1910 of FIG. 19) disposed at the second surface (e.g., the second surface 1002 of FIG. 19). The first layer may include at least one pattern. The second plate may further include a second layer (e.g., the second layer 1920 of FIG. 19) disposed at the first layer. The second layer may include at least one color.

According to an embodiment of the disclosure, the first layer (e.g., the first layer 1910 of FIG. 19) may include a polymer film (e.g., the base film 1911 of FIG. 19). The first layer may include a transparent adhesive layer (e.g., the transparent adhesive layer 1912 of FIG. 19) between the second surface (e.g., the second surface 1002 of FIG. 19) and the polymer film. The first layer may include a pattern layer (e.g., the pattern layer 1913 of FIG. 19) bonded to the polymer film. The pattern layer may include the at least one pattern.

According to an embodiment of the disclosure, the pattern layer (e.g., the pattern layer 1913 of FIG. 19) may include a UV molding layer including the at least one pattern formed at an interface between the first layer (e.g., the first layer 1910 of FIG. 19) and the second layer (e.g., the second layer 1920 of FIG. 19).

According to an embodiment of the disclosure, the at least one pattern may include a gradient pattern.

According to an embodiment of the disclosure, the second plate (e.g., the plate 1300 of FIG. 13A) may include a flat portion (e.g., the flat portion 1010 of FIG. 13A) forming the rear surface and a curved border portion (e.g., the curved border portion 1020 of FIG. 13A) forming the side surface. The curved border portion may include a first curved border (e.g., the first curved border 1021 of FIG. 13A), a second curved border (e.g., the second curved border 1022 of FIG. 13A) disposed opposite to the first curved border, a third curved border (e.g., the third curved border 1023 of FIG. 13A) connecting one end of the first curved border and one end of the second curved border, and a fourth curved border (e.g., the fourth curved border 1024 of FIG. 13A) connecting the other end of the first curved border and the other end of the second curved border and disposed opposite to the third curved border.

According to an embodiment of the disclosure, a height in which an edge of the first curved border (e.g., the first curved border 1021 of FIG. 13A), the second curved border (e.g., the second curved border 1022 of FIG. 13A), the third curved border (e.g., the third curved border 1023 of FIG. 13A), or the fourth curved border (e.g., the fourth curved border 1024 of FIG. 13A) is vertically spaced apart from the flat portion (e.g., the flat portion 1010 of FIG. 13A) may be 1 mm to 10 mm.

According to an embodiment of the disclosure, the second plate (e.g., the second plate 130 of FIG. 2) may further include at least one opening (e.g., the opening 102 of FIG. 2) formed in the flat portion (e.g., the flat portion 1010 of FIG. 13A).

According to an embodiment of the disclosure, the electronic device may further include a camera device (e.g., the second camera device 112 of FIG. 1B) and/or a flash (e.g., the flash 113 of FIG. 1B) disposed in the at least one opening (e.g., the opening 102 of FIG. 2).

According to an embodiment of the disclosure, the second plate (e.g., the second plate 130 of FIG. 2) may further include at least one opening (e.g., the openings 106 of FIG. 2) formed in the curved edge portion (e.g., the curved edge portion 1020 of FIG. 13A).

According to an embodiment of the disclosure, the electronic device may further include a key input device (e.g., the key input devices 117 of FIG. 2) disposed in at least one opening (e.g., the openings 106 of FIG. 2).

According to certain embodiments of the disclosure, an electronic device (e.g., the electronic device of FIG. 1A) may include a housing (e.g., the housing 110 of FIG. 1A or 1B) including a front surface (e.g., the front surface 110A of FIG. 1A), a rear surface (e.g., the rear surface 110B of FIG. 1A), and a side surface (e.g., the side surface 110C of FIG. 1A or 1B) enclosing a space between the front surface and the rear surface. The housing may include a first plate (e.g., the first plate 120 of FIG. 2) forming the front surface. The housing may include a second plate (e.g., the second plate 130 of FIG. 2) forming the rear surface or integrally extended from the side surface to the rear surface. The housing may include a first layer (e.g., the first layer 1910 of FIG. 19) bonded to the second plate in the space. The first layer may include at least one pattern. The housing may include a second layer (e.g., the second layer 1920 of FIG. 19) bonded to the first layer. The second layer may include at least one color. The electronic device may include a display (e.g., the display 101 of FIG. 2) disposed in the space and at least partially visible through the first plate. The second plate may include a first surface (e.g., the first surface 1001 of FIG. 19) forming the rear surface and a second surface (e.g., the second surface 1002 of FIG. 19) disposed opposite to the first surface. At least a portion of the second surface may include a pattern having surface roughness having a height of 0.1 µm to 1 µm. The first layer may be disposed at the second surface between the second surface and the second layer.

According to certain embodiments of the disclosure, the first layer (e.g., the first layer 1910 of FIG. 19) may include a polymer film (e.g., the base film 1911 of FIG. 19). The first layer (e.g., the first layer 1910 of FIG. 19) may include a transparent adhesive layer (e.g., the transparent adhesive layer 1912 of FIG. 19) between the second surface (e.g., the second surface 1002 of FIG. 19) and the polymer film. The first layer may include a pattern layer (e.g., the pattern layer 1913 of FIG. 19) bonded to the polymer film. The pattern layer may include the at least one pattern.

According to certain embodiments of the disclosure, the pattern layer (e.g., the pattern layer 1913 of FIG. 19) may include an ultraviolet (UV) molding layer including the at least one pattern formed at an interface between the first layer (e.g., the first layer 1910 of FIG. 19) and the second layer (e.g., the second layer 1920 of FIG. 19).

According to certain embodiments of the disclosure, the at least one pattern may include a gradient pattern.

According to an embodiment of the disclosure, a method (e.g., the production flow 300 of FIG. 3) of producing a housing of an electronic device may include forming (e.g., the operation 310 of FIG. 3) a pattern having surface roughness having a maximum height of 0.1 µm to 1 µm at a molding surface of a die using a laser; and injection molding (e.g., the operation 330 of FIG. 3) a structure through the die. According to an embodiment, the pattern may be formed using a laser. According to an embodiment, the housing may include a first surface (e.g., the first surface 1001 of FIG. 13A) and a second surface (e.g., the second surface 1002 of FIG. 13A or 13B) positioned inside the electronic device at a side opposite to that of the first surface. The second surface may have surface roughness having a height of 0.1 µm to 1 µm by imprinting the pattern (see FIG. 15).

According to an embodiment of the disclosure, the pattern (e.g., the pattern 600 of FIG. 6, the pattern 701 of FIG. 7A, the pattern 702 of FIG. 7B, the pattern 703 of FIG. 7C, or the pattern 800 of FIG. 8) may be formed using a femtosecond laser having an ultrashort pulse width expressed in the domain of femtoseconds ($10^{15}$ seconds).

According to an embodiment of the disclosure, the method may further include disposing at least one layer at one surface of the structure in which the pattern is implanted (see FIG. 16).

According to an embodiment of the disclosure, the housing may be a plate (e.g., the plate 1300 of FIG. 13A) extended integrally from a side surface (e.g., the side surface 110C of FIG. 1B) to a rear surface (e.g., the rear surface 110B of FIG. 1B) of the electronic device and include a first surface (e.g., the first surface 1001 of FIG. 13A) forming the side surface and the rear surface and a second surface (e.g., the second surface 1002 of FIG. 13A or 13B) disposed opposite to the first surface. The second surface may have surface roughness having a height of 0.1 µm to 1 µm by implanting the pattern (see FIG. 15).

According to an embodiment of the disclosure, by forming a pattern having surface roughness having a height of about 0.1 µm to 1 µm at the surface of the housing, a visual surface texture can be implemented using a diffraction phenomenon without a restriction on a surface shape and without a film or a UV molding layer having a fine pattern.

In addition, effects obtained or predicted by certain embodiments of the disclosure will be disclosed either directly or implicitly in the detailed description of the embodiments of the disclosure. For example, various effects predicted according to certain embodiments of the disclosure will be disclosed within the detailed description to be described later.

The embodiments of the disclosure disclosed in this specification and drawings only present a specific example in order to easily describe the technical contents according to an embodiment of the disclosure and to help an understanding of the embodiments of the disclosure, and they do not intend to limit the scope of the embodiments of the disclosure. Accordingly, all changes or modifications derived from the technical idea of certain embodiments of the disclosure in addition to the embodiments described herein should be construed as being included in the scope of certain embodiments of the disclosure without departing from the scope of the disclosure.

What is claimed is:

1. An electronic device, comprising:
a first plate forming a front surface of a housing;
a second plate integrally forming a rear surface and a side surface of the housing; and
a display disposed in a space enclosed between the front surface, side surface and rear surface, and at least partially visible through the first plate,
wherein the second plate includes a first surface and a second surface disposed opposite to the first surface; and at least a portion of the second surface includes a pattern having surface roughness having a height of 0.1 µm to 1 µm, and
wherein the pattern is formed in a die, and imprinted on to the second surface using a laser having a pulse width equal to or less than a preset or specified value.

2. The electronic device of claim 1, wherein the pattern includes a plurality of dimples or a plurality of slits.

3. The electronic device of claim 1, wherein a parting line formed at least partially along the side surface.

4. An electronic device comprising:
a first plate forming a front surface of a housing;
a second plate integrally forming a rear surface and a side surface of the housing; and
a display disposed in a space enclosed between the front surface, side surface and rear surface, and at least partially visible through the first plate,
wherein the second plate includes a first surface and a second surface disposed opposite to the first surface,
at least a portion of the second surface includes a pattern having surface roughness having a height of 0.1 µm to 1 µm, and
the side surface includes a trace in which an injection portion, molded at a gate of a die, is removed on the parting line,
wherein a parting line is formed at least partially along the side surface.

5. The electronic device of claim 1, wherein the laser comprises a femto laser having an ultrashort pulse width less than a picosecond, and defined in femtoseconds.

6. An electronic device, comprising:
a housing defining a front surface, a rear surface, and a side surface, and a space enclosed between the front surface and the rear surface,
wherein the housing includes:
a first plate forming the front surface,
a second plate forming the rear surface and the side surface, integrally extending from the side surface to the rear surface, wherein the second plate includes a first surface forming the rear surface and a second surface disposed opposite to the first surface,
a first layer bonded to the second plate within the space and including at least one pattern, and
a second layer bonded to the first layer, the second layer including at least one color; and
a display disposed in the space and at least partially visible through the first plate,
wherein the first layer is disposed at the second surface between the second surface and the second layer, and
wherein at least a portion of the second surface includes a pattern having surface roughness having a height of 0.1 µm to 1 µm.

7. The electronic device of claim 6, wherein the first layer includes:
a polymer film;
a transparent adhesive layer disposed between the second surface and the polymer film; and
a pattern layer bonded to the polymer film, forming the at least one pattern.

8. The electronic device of claim 7, wherein the pattern layer includes an ultraviolet (UV) molding layer disposed at an interface between the first layer and the second layer.

9. The electronic device of claim 7, wherein the at least one pattern includes a gradient pattern.

* * * * *